(12) United States Patent
Ohno

(10) Patent No.: US 8,633,060 B2
(45) Date of Patent: Jan. 21, 2014

(54) SEMICONDUCTOR DEVICE PRODUCTION METHOD AND SEMICONDUCTOR DEVICE

(75) Inventor: Hirotaka Ohno, Miyoshi (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 154 days.

(21) Appl. No.: 13/238,740

(22) Filed: Sep. 21, 2011

(65) Prior Publication Data

US 2012/0043662 A1 Feb. 23, 2012

Related U.S. Application Data

(63) Continuation of application No. PCT/JP2010/051327, filed on Feb. 1, 2010.

(51) Int. Cl.
*H01L 21/00* (2006.01)
*H01L 23/34* (2006.01)

(52) U.S. Cl.
USPC ........... 438/122; 438/127; 257/675; 257/712; 257/720; 257/796; 257/E23.051; 257/E21.499; 257/E21.519

(58) Field of Classification Search
USPC ........... 438/15, 26, 51, 55, 64, 106, 124–127, 438/122, FOR. 413; 257/678, 257/E21.499–E21.519, 276, 625, 675, 706, 257/707, 712–722, 796, E33.065, E31.131, 257/E23.051, E23.08–E23.113
See application file for complete search history.

(56) References Cited

U.S. PATENT DOCUMENTS

| 7,145,254 B2 * | 12/2006 | Hirano et al. | 257/796 |
| 7,215,020 B2 * | 5/2007 | Nakase et al. | 257/706 |
| 7,247,929 B2 * | 7/2007 | Miura et al. | 257/675 |
| 8,193,622 B2 * | 6/2012 | Madrid | 257/678 |

FOREIGN PATENT DOCUMENTS

| JP | 11-150090 A | 6/1999 |
| JP | 2001-308263 A | 11/2001 |
| JP | 2002-359323 A | 12/2002 |
| JP | 2003-188318 A | 7/2003 |
| JP | 2004-208411 A | 7/2004 |
| JP | 2004-303869 A | 10/2004 |
| JP | 2006-179655 A | 7/2006 |
| JP | 2007-073987 A | 3/2007 |
| JP | 2008-078561 A | 4/2008 |
| JP | 2008-227131 A | 9/2008 |

OTHER PUBLICATIONS

International Search Report of PCT/JP2010/001327 mailed Mar. 30, 2010.

* cited by examiner

*Primary Examiner* — Jasmine Clark
(74) *Attorney, Agent, or Firm* — Kenyon & Kenyon LLP

(57) ABSTRACT

A purpose of the application is to provide a semiconductor device production method capable of reducing complexity of production operations and keeping production costs low, and enhancing reliability, and a semiconductor device. One aspect of the invention provides a method of producing a semiconductor device, the method including a first bonding step of bonding a first electrode plate and a semiconductor device portion, and a second bonding step of bonding the semiconductor device portion and a second electrode plate. The method includes a sealing step of forming a sealed composite body by covering target surfaces of a composite body formed by the first bonding step with resin, the target surfaces being surfaces other than a second surface of the first electrode plate and the second surface of the semiconductor device portion. The second bonding step is performed after the sealing step.

12 Claims, 23 Drawing Sheets

PRESSURE APPLICATION

SEMICONDUCTOR DEVICE PRODUCTION METHOD AND SEMICONDUCTOR DEVICE

CROSS-REFERENCE TO RELATED APPLICATIONS

This application is a continuation application based upon and claims the benefit of the prior PCT International Patent Application No. PCT/JP2010/051327 filed on Feb. 1, 2010, the entire contents of which are incorporated herein by reference.

TECHNICAL FIELD

The present invention relates to a method for producing a semiconductor device provided with electrode plates connected to electrodes and placed on both sides of a power device, and to a semiconductor device.

BACKGROUND ART

In conventional methods for producing semiconductor devices provided with electrode plates on both sides of a power device (semiconductor device), electrode plates were bonded to both sides of the power device to form a composite body, after which this composite body was sealed with a thermosetting resin such as an epoxy resin (resin sealing step).

Thermosetting resins such as epoxy resins have such characteristics as cure shrinkage where they undergo volumetric shrinkage due to a bridging reaction when hardening at a high temperature, and heat shrinkage where they undergo volumetric shrinkage when cooled from a high-temperature state.

In a semiconductor device provided with electrode plates on both sides of a power device, the two electrode plates provided on both sides of the power device are separated a certain distance away from each other, with the power device, an electrode plate block and the like being provided between the electrode plates. In the resin sealing step mentioned above, the space between these two electrode plates was sealed with a thermosetting resin (hereinafter referred to as sealing resin). However, when the sealing resin injected between the two electrode plates undergoes shrinkage due to cure shrinkage or heat shrinkage, the two electrode plates try to approach closer to each other, while the power device, electrode plate block and the like come in their way. This may result in stress applied to the bonded portion between the sealing resin and electrode plates to cause separation, which may eventually lead to separation of the sealing resin and electrode plates when the bond strength between the sealing resin and electrode plates is overcome by this stress, whereby reliability of the semiconductor device may be reduced.

Similarly, there is a possibility that reliability of the semiconductor device may be reduced because of the sealing resin and electrode plates separating from each other in thermal cycles under a usage environment of the semiconductor device.

Accordingly, Patent Document 1 discloses a technique wherein a coating of resin such as polyamide resin or polyimide resin is applied between the sealing resin and electrode plates to enhance intimate contact between the sealing resin and electrode plates and to improve reliability of the semiconductor device.

RELATED ART DOCUMENTS

Patent Documents

Patent Document 1: JP 2003-188318A

DISCLOSURE OF THE INVENTION

Problems to be Solved by the Invention

However, the resin coating such as polyamide resin or polyimide resin used in the technique of Patent Document 1 is expensive. Moreover, in application of a resin coating, an additional step of inspecting the resin-coated portion for any uncoated spots or any entrapped air is required. Therefore production costs are increased with the technique of Patent Document 1.

Further, in order to apply a resin coating so that the electrode plates or power device are not exposed on inner sides of electrode plates on both sides of the power device, they must be immersed in a tank filled with a stock solution of resin coating. In this process, additional steps are necessary such as a step of preliminarily masking portions that must not be electrically insulated by the resin coating (for example control lines connecting the power device and control terminals) prior to the application of the resin coating or a step of cleaning after the application of the resin coating. Therefore production operations are complex with the technique of Patent Document 1.

Accordingly, the present invention has been made to solve the problems described above and has an object to provide a method of producing a semiconductor device with which reliability of the semiconductor device can be improved while complexity of production operations is reduced and production costs are kept low, and a semiconductor device.

Means of Solving the Problems

One aspect of the present invention made to solve the problems above provides a method of producing a semiconductor device, the method including a first bonding step of bonding a first surface of a first electrode plate and a first surface of a semiconductor device portion, and a second bonding step of bonding a second surface of the semiconductor device portion and a first surface of a second electrode plate, wherein the method includes a sealing step of forming a sealed composite body by covering target surfaces of a composite body of the first electrode plate and the semiconductor device portion formed by the first bonding step with resin, the target surfaces being surfaces other than a second surface of the first electrode plate and the second surface of the semiconductor device portion, and the second bonding step is performed after the sealing step.

According to this aspect, since the second electrode plate is not bonded to the composite body yet in the sealing step, stress generated in the resin by shrinkage thereof is released so that the first electrode plate and the semiconductor device portion do not separate from the resin, whereby reliability of the semiconductor device is improved.

Further, since a resin coating such as polyamide resin or polyimide resin need not be provided, production costs are kept low and complexity of production operations is reduced.

It should be understood that an embodiment of the semiconductor device portion includes a composite body of a semiconductor device and an electrode plate block.

In the above aspect of the present invention, it is preferable that the sealing step includes forming the sealed composite body by covering the target surfaces of the composite body and the second surface of the semiconductor device portion with the resin and then removing the resin covering the second surface of the semiconductor device portion.

According to this configuration, when covering the composite body inserted in a mold with resin, for example, a clearance can be provided between the second surface of the semiconductor device portion and the mold. This can prevent interference between the second surface of the semiconductor device portion and the mold due to dimensional variations in various constituent parts of the composite body.

In the above aspect of the present invention, it is preferable that the second bonding step includes heating the sealed composite body to a temperature that is lower than a heat proof temperature of the resin and lower than a melting point of a first bonding material for bonding the first surface of the first electrode plate and the first surface of the semiconductor device portion.

According to this configuration, the resin does not undergo degeneration or deterioration, the first electrode plate and the semiconductor device portion do not separate from the resin, and the first bonding material can bond the second surface of the semiconductor device portion and the first surface of the second electrode plate without undergoing melting and/or degeneration.

In the above aspect of the present invention, it is preferable that the second bonding step includes providing a through hole in the second electrode plate extending through the second electrode plate to open on its first and second surfaces, and supplying a second bonding material through the through hole for bonding the second surface of the semiconductor device portion and the first surface of the second electrode plate.

According to this configuration, the second bonding material can be easily supplied from the through hole to the portion between the second surface of the semiconductor device portion and the first surface of the second electrode plate.

Any redundant second bonding material will spill out of the through hole, so that the control accuracy of the supply amount of the second bonding material can be lowered.

In the above aspect of the present invention, it is preferable that the second bonding step includes heating the second electrode plate to a temperature that is higher than a melting point of the second bonding material for bonding the second surface of the semiconductor device portion and the first surface of the second electrode plate, and applying the second bonding material to the first surface of the second electrode plate.

According to this configuration, with the second bonding material being applied to the first surface of the second electrode plate, the second bonding material can easily be kept in a molten state and brought into intimate contact with the second surface of the semiconductor device portion, to bond the second surface of the semiconductor device portion and the first surface of the second electrode plate.

In the above aspect of the present invention, it is preferable that the second bonding step includes heating the second electrode plate to a temperature that is higher than a melting point of the second bonding material for bonding the second surface of the semiconductor device portion and the first surface of the second electrode plate, and applying the second bonding material to the first surface of the second electrode plate.

According to this configuration, the second surface of the semiconductor device portion and the first surface of the second electrode plate can be bonded without a gap formed between the sealed composite body and the second electrode plate. Therefore, the bonding layer for bonding the second surface of the semiconductor device portion and the first surface of the second electrode plate is maintained even if the second electrode plate is subjected to an external force.

Another aspect of the present invention made to solve the problems above provides a method of producing a semiconductor device, the method including a first bonding step of bonding a first surface of a first electrode plate and a first surface of a semiconductor device portion, wherein the method includes a sealing step of forming a sealed composite body by covering target surfaces of a composite body of the first electrode plate and the semiconductor device portion formed by the first bonding step with resin, the target surfaces being surfaces other than a second surface of the first electrode plate and a second surface of the semiconductor device portion, and a pressure contact step of bringing a protrusion provided on a first surface of a second electrode plate into pressure contact with the second surface of the semiconductor device portion of the sealed composite body.

According to this configuration, since the second electrode plate is not in pressure contact with the composite body yet in the sealing step, stress generated in the resin by shrinkage thereof is released so that the first electrode plate and the semiconductor device portion do not separate from the resin, whereby reliability of the semiconductor device is improved.

Further, since a resin coating such as polyamide resin or polyimide resin need not be provided, production costs are kept low and complexity of production operations is reduced.

Moreover, since the semiconductor device portion and the second electrode plate can be connected by bringing the protrusion provided on the first surface of the second electrode plate into pressure contact with the second surface of the semiconductor device portion, bonding materials for bonding the semiconductor device portion and the second electrode plate and heating steps are no longer necessary, whereby production costs can be made low.

In the above aspect of the present invention, preferably, the method includes a heat-dissipating material application step of applying a heat-dissipating material between the semiconductor device portion and the second electrode plate.

According to this configuration, heat generated in the semiconductor device portion by a large current flowing therein is dissipated through the heat-dissipating material from the semiconductor device portion to the second electrode plate, and thus a large current can flow between the semiconductor device portion and the second electrode plate.

Another aspect of the present invention made to solve the problems above provides a semiconductor device in which a first surface of a first electrode plate is bonded to a first surface of a semiconductor device portion and a second surface of the semiconductor device portion is bonded to a first surface of a second electrode plate, wherein the device includes a sealed composite body formed by covering target surfaces of a composite body of the first electrode plate and the semiconductor device portion with resin, the target surfaces being surfaces other than a second surface of the first electrode plate and the second surface of the semiconductor device portion, and the resin portion of the sealed composite body is not bonded to the first surface of the second electrode plate, and is provided further than the first surface of the second electrode plate toward a side where the semiconductor device portion is disposed in a direction of arrangement of the semiconductor device portion and the second electrode plate.

In the above aspect of the present invention, preferably, the second electrode plate includes a through hole extending through the second electrode plate to open on its first and second surfaces.

In the above aspect of the present invention, preferably, the sealed composite body includes a recess formed such that the second surface of the semiconductor device portion is recessed more than a surface of the resin in a direction of arrangement of the first electrode plate and the semiconductor device portion, and a bonding layer formed in the recess for bonding the second surface of the semiconductor device portion and the first surface of the second electrode plate.

Another aspect of the present invention made to solve the problems above provides a semiconductor device in which a first surface of a first electrode plate is bonded to a first surface of a semiconductor device portion, wherein the device includes a second electrode plate having a first surface formed with a protrusion to make pressure contact with a second surface of the semiconductor device portion, and a sealed composite body formed by covering target surfaces of a composite body of the first electrode plate and the semiconductor device portion with resin, the target surfaces being surfaces other than a second surface of the first electrode plate and the second surface of the semiconductor device portion, and the resin portion of the sealed composite body is not bonded to the first surface of the second electrode plate, and is provided further than the first surface of the second electrode plate toward a side where the semiconductor device portion is disposed in a direction of arrangement of the semiconductor device portion and the second electrode plate.

Effects of the Invention

According to a semiconductor device production method and a semiconductor device of the invention, it is possible to reduce complexity of production operations and hold production costs low, and achieve enhanced reliability of the semiconductor device.

MODE FOR CARRYING OUT THE INVENTION

Hereinafter, a preferred embodiment of the present invention will be described in detail with reference to the accompanying drawings.

Figure 1:
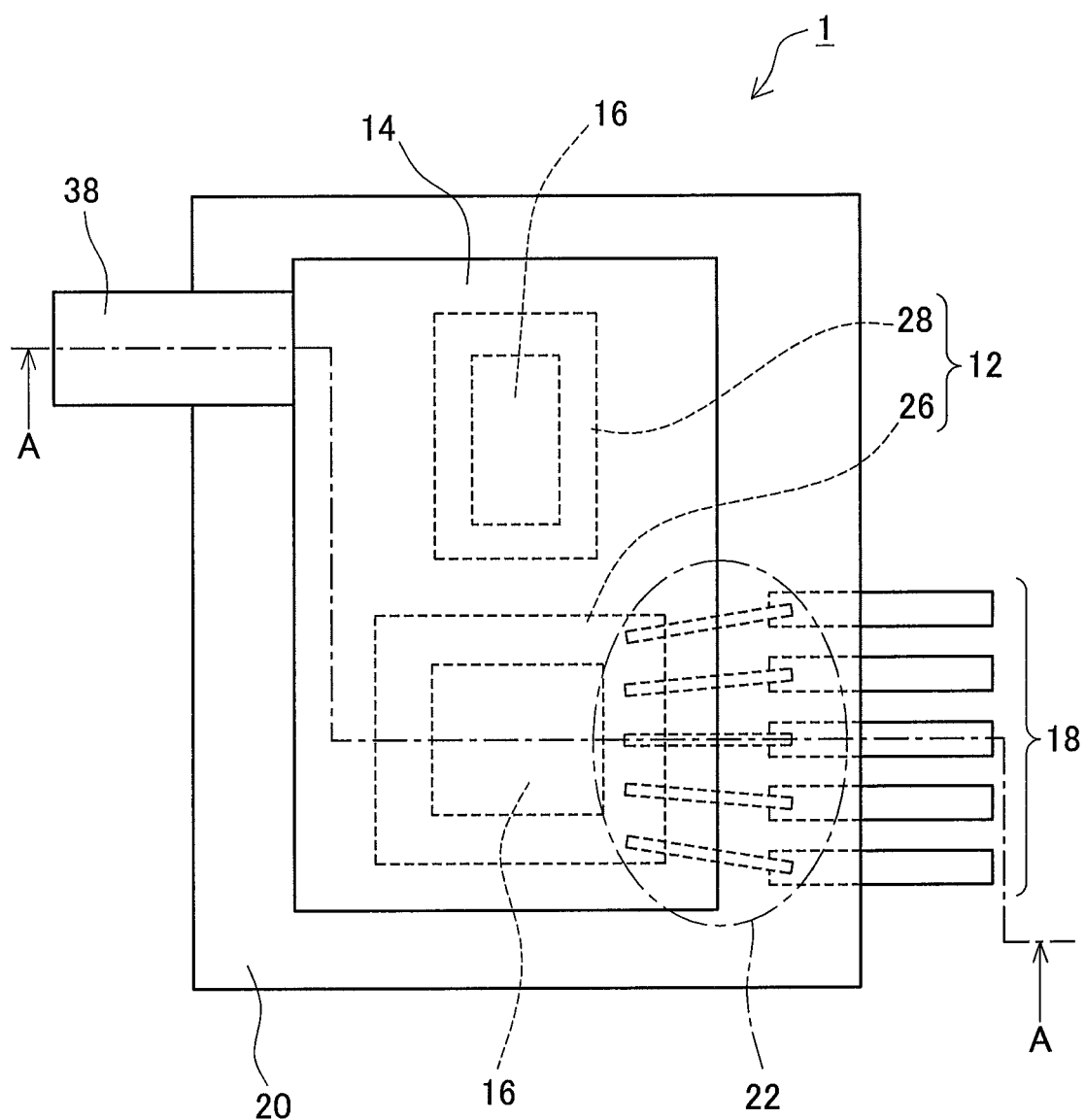
FIG. 1 is a top plan view of a semiconductor device.
Figure 2:
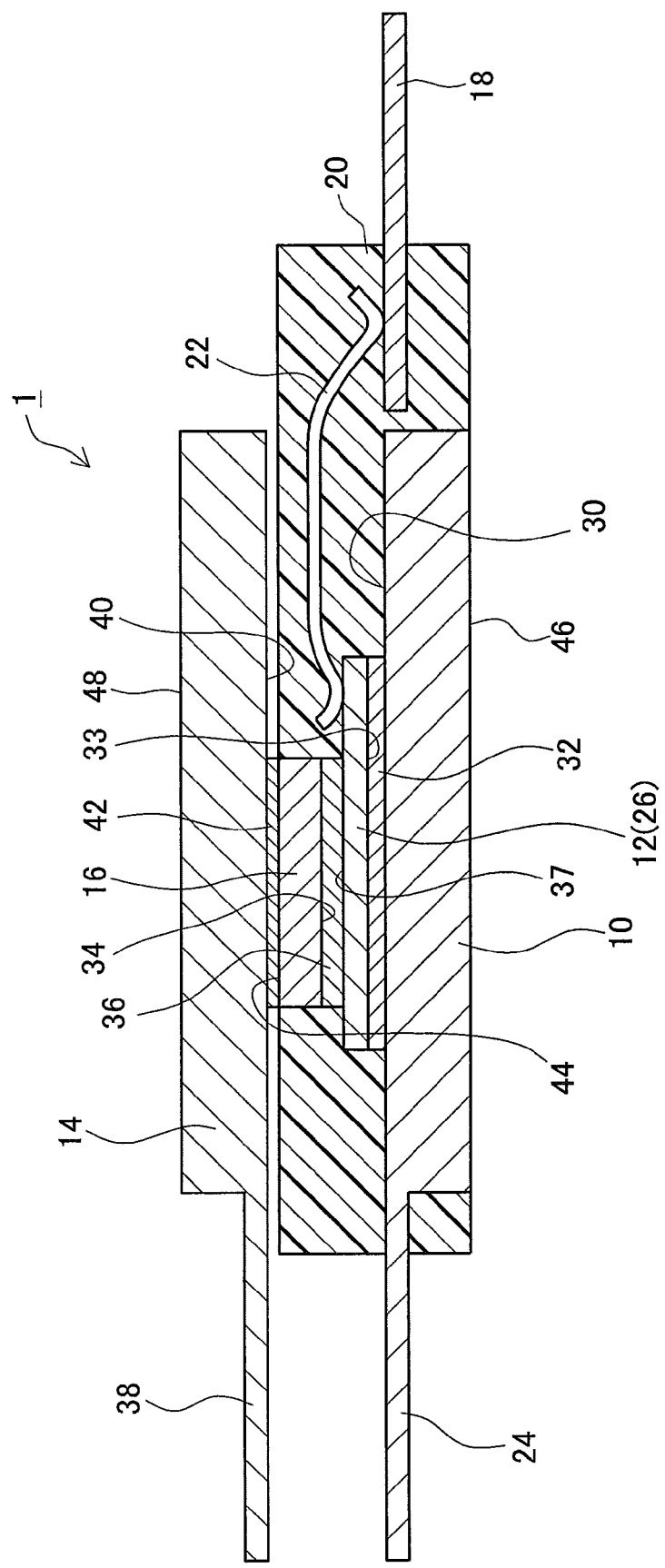
FIG. 2 is a cross sectional view taken along a line A-A in FIG. 1.

First, the overall structure of a semiconductor device will be described. FIG. 1 is a top view of the semiconductor device, and FIG. 2 is a cross sectional view taken along a line A-A in FIG. 1. As shown in FIGS. 1 and 2, the semiconductor device 1 includes, primarily, a backside electrode plate 10, a power device 12, an upper electrode plate 14, an electrode plate block 16, control terminals 18, sealing resin 20, and control lines 22, etc.

The backside electrode plate 10 is formed in a generally flat rectangular shape and provided with a bus bar 24.

The power device 12 is one example of a constituent part of a semiconductor device portion, i.e., it is a semiconductor switching device for high power switching. In this embodiment, the power device 12 includes an IGBT 26 (transistor) and a diode 28. FIG. 2 shows the IGBT 26 only to represent the power device 12. The power device 12 is provided with electrodes (not shown) on both sides. An inner surface 30 of the backside electrode plate 10 (one example of a first surface of a first electrode plate of the present invention) is bonded to electrodes on a surface 33 of the power device 12 (one example of a first surface of a semiconductor device portion of the present invention) via a solder layer 32.

The upper electrode plate 14 is formed in a generally flat rectangular shape and provided with a bus bar 38. An inner surface 40 of this upper electrode plate 14 (one example of a first surface of a second electrode plate of the present invention) is bonded to a surface 44 of the electrode plate block 16 (one example of a second surface of a semiconductor device portion of the present invention) via a solder layer 42. The upper electrode plate 14 may be brought into pressure contact with the surface 44 of the electrode plate block 16 as will be described later. This establishes electrical and thermal connection between the upper electrode plate 14 and the electrode plate block 16. The upper electrode plate 14 may be provided with a through hole 62 as will be described later (see FIG. 12).

The electrode plate block 16 is one example of a constituent part that forms the semiconductor device portion with the power device 12. The block 16 is formed in a rectangular block shape, with a surface 34 being bonded to electrodes on a surface 37 of the power device 12 via a solder layer 36. In this embodiment, the area of the surface 34 of the electrode plate block 16 is smaller than the area of the IGBT 26 or diode 28 so that, for example, the bonding area between the IGBT 26 and the electrode plate block 16 is approximately the same as the size of the electrodes of the IGBT 26.

A plurality of control electrodes (not shown) are provided to an end portion of the IGBT 26. The control lines 22 are connected respectively at one end to these control electrodes. The control lines 22 are connected to the control terminals 18 at the other end. For the control lines 22, for example, aluminum bonding wire is used.

The backside electrode plate 10, upper electrode plate 14, electrode plate block 16, and control terminals 18 are made of copper sheet that may additionally be plated with nickel. Alternatively, they may be made of aluminum sheet plated with nickel.

The sealing resin 20 is a fluid thermosetting resin hardened such as to cover surfaces of the backside electrode plate 10, solder layer 32, power device 12, solder layer 36, and the electrode plate block 16 (examples of target surfaces of the present invention) except for an outer surface 46 of the backside electrode plate 10 (one example of a second surface of a first electrode plate of the present invention) and the surface 44 of the electrode plate block 16 so as to seal the space between the backside electrode plate 10 and the upper electrode plate 14 and the space surrounding the backside electrode plate 10. An epoxy resin, for example, is used for the sealing resin 20.

The overall structure of the semiconductor device is as described above. Hereinafter the method for producing the semiconductor device will be described.

EXAMPLE 1

Figure 3:
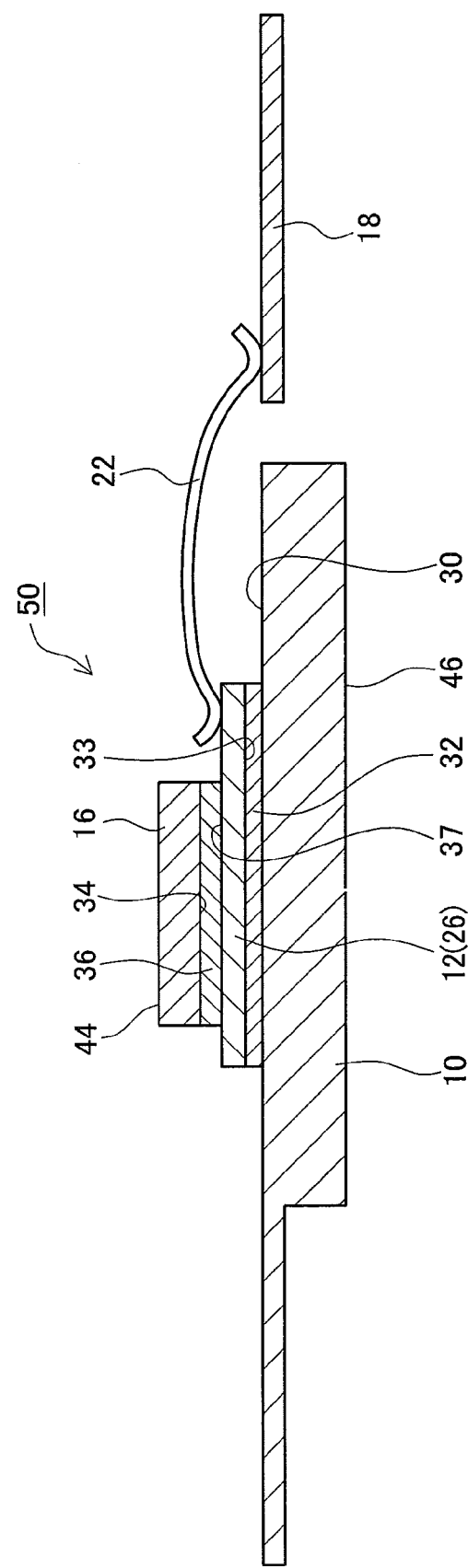
FIG. 3 is a view showing a production method of Example 1.
Figure 4:
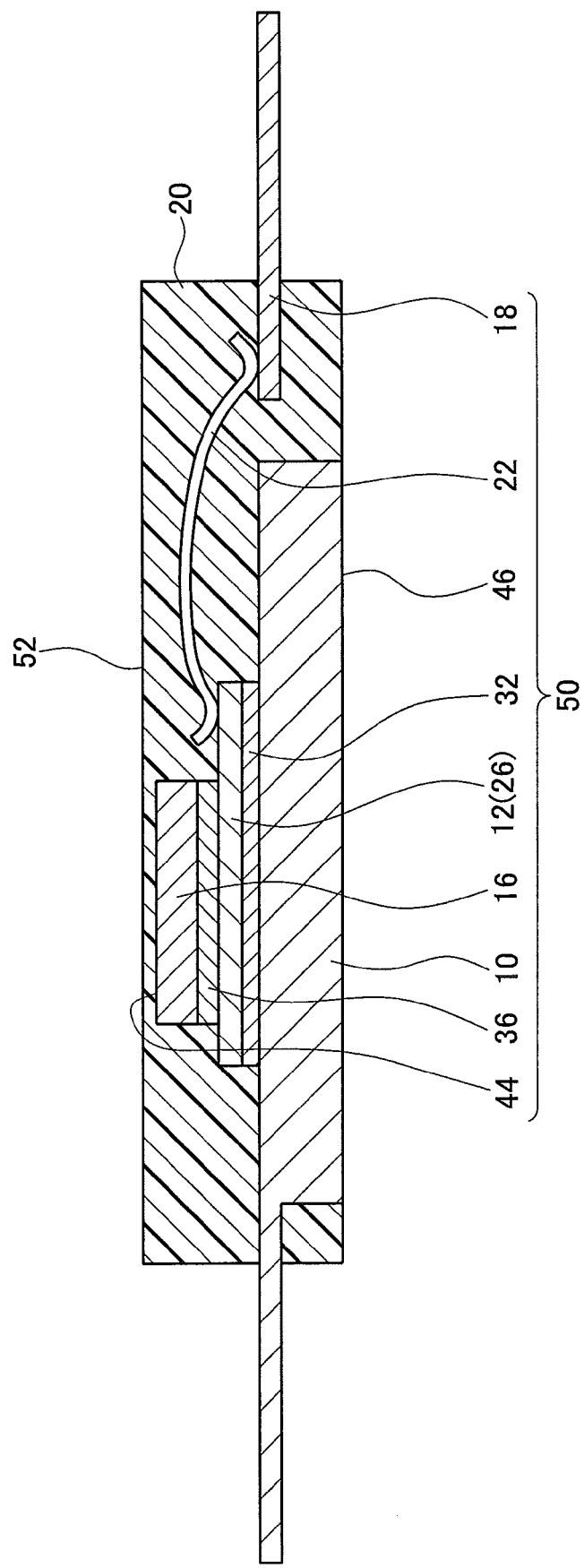
FIG. 4 is another view showing the production method of Example 1.
Figure 5:
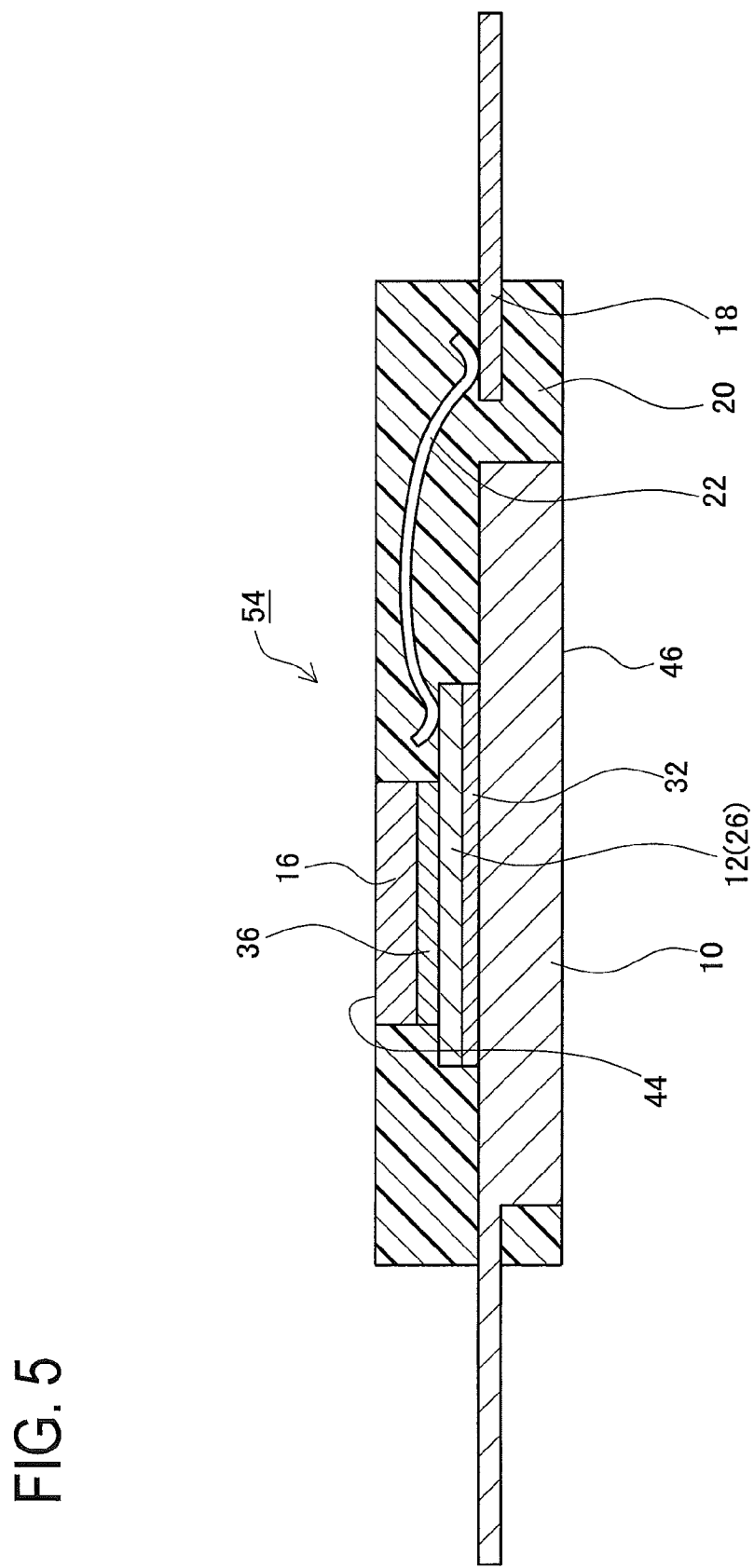
FIG. 5 is another view showing the production method of Example 1.

FIGS. 3 to 5 illustrate the production method of Example 1. While FIGS. 3 to 5 show a cross section of a portion containing the IGBT 26 of the power device 12, the description below shall apply also to a cross section of a portion containing the diode 28.

First, as shown in FIG. 3, the inner surface 30 of the backside electrode plate 10 is bonded by soldering to the surface 33 of the power device 12 (one example of a first bonding step of the present invention), and the surface 37 of the power device 12 is bonded by soldering to the surface 34 of the electrode plate block 16. Thereby, the backside electrode plate 10, solder layer 32, power device 12, solder layer 36, and the electrode plate block 16 are laminated upon one another in this order. Control electrodes (not shown) provided at an end portion of the IGBT 26 are connected to the control terminals 18 via the control lines 22. A composite body 50 shown in FIG. 3 is formed through the process described above.

Next, as shown in FIG. 4, the composite body 50 is covered with the sealing resin 20 by transfer molding, potting, or the like, to seal the surrounding space of the composite body 50. At this time, the outer surface 46 of the backside electrode plate 10 is not covered with the sealing resin 20.

In transfer molding, in particular, the outer surface 46 of the backside electrode plate 10 is closely contacted to a mold when injecting fluid resin into the mold so that the fluid resin does not flow onto the outer surface 46 of the backside electrode plate 10. Thus the outer surface 46 of the backside electrode plate 10 is not covered with the sealing resin 20. On the other hand, a sufficient clearance is given between the surface 44 of the electrode plate block 16 and the mold so that the fluid resin can flow therein to cover the surface 44 of the electrode plate block 16 with the sealing resin 20. This prevents interference between the composite body 50 and the mold due to variations in height of various constituent parts of the composite body 50.

When the high-temperature fluid resin hardens into the sealing resin 20, the resin 20 undergoes shrinkage due to cure shrinkage or heat shrinkage. However, the upper electrode plate 14 is not bonded onto the composite body 50 yet so that the sealing resin 20 has an open surface 52. Therefore, stress generated in the sealing resin 20 due to shrinkage thereof is released and no stress that would cause separation is applied to the bonded portion between the backside electrode plate 10 and the sealing resin 20. Similarly, separation does not occur in the bonded portion between the power device 12 and the sealing resin 20 and in the bonded portion between the electrode plate block 16 and the sealing resin 20, either.

Next, as shown in FIG. 5, the sealing resin 20 present on the side of the surface 44 of the electrode plate block 16 is removed by grinding to a height where the surface 44 of the electrode plate block 16 is exposed. A sealed composite body 54 is thus formed as shown in FIGS. 4 and 5 described above (one example of a sealing step of the present invention).

Subsequently, the upper electrode plate 14 is bonded to the surface 44 of the electrode plate block 16 of the sealed composite body 54 (one example of a second bonding step of the present invention). The semiconductor device 1 described above and shown in FIG. 2 is produced through the process described above. In the example shown in FIG. 2, the upper electrode plate 14 and the electrode plate block 16 are bonded together by soldering, so that the solder layer 42 is formed.

As the upper electrode plate 14 is bonded to the surface 44 of the electrode plate block 16, the upper electrode plate 14 is electrically and thermally bonded to the electrode plate block 16. Care should be taken during the bonding so that the sealing resin 20 does not undergo degeneration. Care should also be taken so that no separation occurs in the bonded portion between the electrode plate block 16 and the sealing resin 20, bonded portion between the power device 12 and the sealing resin 20, and bonded portion between the backside electrode plate 10 and the sealing resin 20. Care should also be taken so that the solder layers 32 or 36 do not undergo melting and/or degeneration.

In this example, a low-melting-point solder having a melting point lower than that of the solder used for the solder layer 32 or 36 and lower than a heat proof temperature of the sealing resin 20 could be considered for use as the solder layer 42. This will prevent the sealing resin 20 from undergoing degeneration during bonding, prevent bonded portions between various constituent parts of the sealed composite body 54 and the sealing resin 20 from undergoing separation, and prevent the solder layer 32 or 36 from undergoing melting and/or degeneration.

Bonding methods using ultrasonic bonding, bonding methods that achieve bonding using conductive adhesives, bonding methods based on bonding techniques using Ag nanoparticles or micro-based silver oxide particles, or bonding methods using screw fastening or rivet connection could be considered as other methods for bonding the upper electrode plate 14 and the electrode plate block 16.

As described above, in this example, the surrounding space of the composite body 50 before bonding the upper electrode plate 14 to the electrode plate block 16 is sealed with the sealing resin 20 to form the sealed composite body 54. Then, the upper electrode plate 14 is bonded to the electrode plate block 16. Therefore, separation in the bonded portion between the backside electrode plate 10 and the sealing resin 20 due to shrinkage of the sealing resin 20 can be prevented. Similarly, separation in the bonded portion between the power device 12 and the sealing resin 20, and separation in the bonded portion between the electrode plate block 16 and the sealing resin 20 can also be prevented.

Further, in this example, since the sealed composite body 54 is formed without the upper electrode plate 14 bonded to the electrode plate block 16, the sealing resin 20 is not bonded to the inner surface 40 of the upper electrode plate 14. Therefore, even though the sealing resin 20 undergoes shrinkage during the production process of the semiconductor device 1 or in thermal cycles under usage environments of the semiconductor device 1, the stress is not trapped in the sealing resin 20 between the backside electrode plate 10 and the upper electrode plate 14. Accordingly, separation in the bonded portions between the backside electrode plate 10, power device 12, or electrode plate block 16 and the sealing resin 20 can be prevented.

This in turn means that the intimate contact between the backside electrode plate 10, power device 12, or electrode plate block 16 and the sealing resin 20 can be ensured without providing a coating of resin such as polyamide resin or polyimide resin, whereby reliability of the semiconductor device 1 can be improved while the complexity of production operations is reduced and production costs are kept low.

Further, in this example, the sealing resin 20 is provided further than the inner surface 40 of the upper electrode plate 14 toward the side where the electrode plate block 16 is disposed in a direction of arrangement of the electrode plate block 16 and the upper electrode plate 14, and not provided on the side of an outer surface 48 (one example of a second surface of a second electrode plate of the present invention) further than the inner surface 40 of the upper electrode plate 14. Therefore the amount of use of the sealing resin 20 can be reduced, which leads to a reduction in the cost of the sealing resin and in the weight of the semiconductor device 1.

When the semiconductor device 1 is used under a usage environment with a large temperature difference or when the semiconductor device 1 is large, thermal stress is accordingly large, so that there is a possibility that separation may occur in bonded portions between various parts such as the electrode plate block 16 and the sealing resin 20. In such cases, polyamide resin 56 could be provided beforehand to parts prone to separation.

Figure 6:
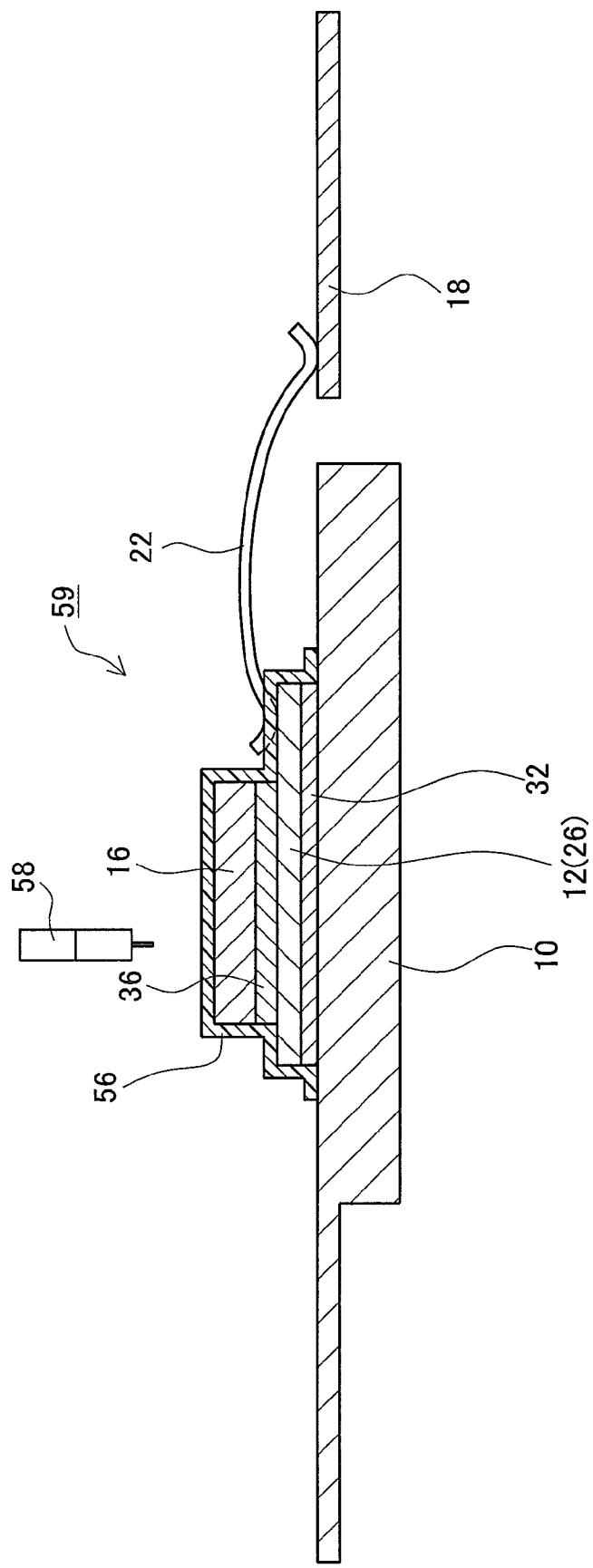
FIG. 6 is a view showing a modified example of the production method of Example 1.
Figure 7:
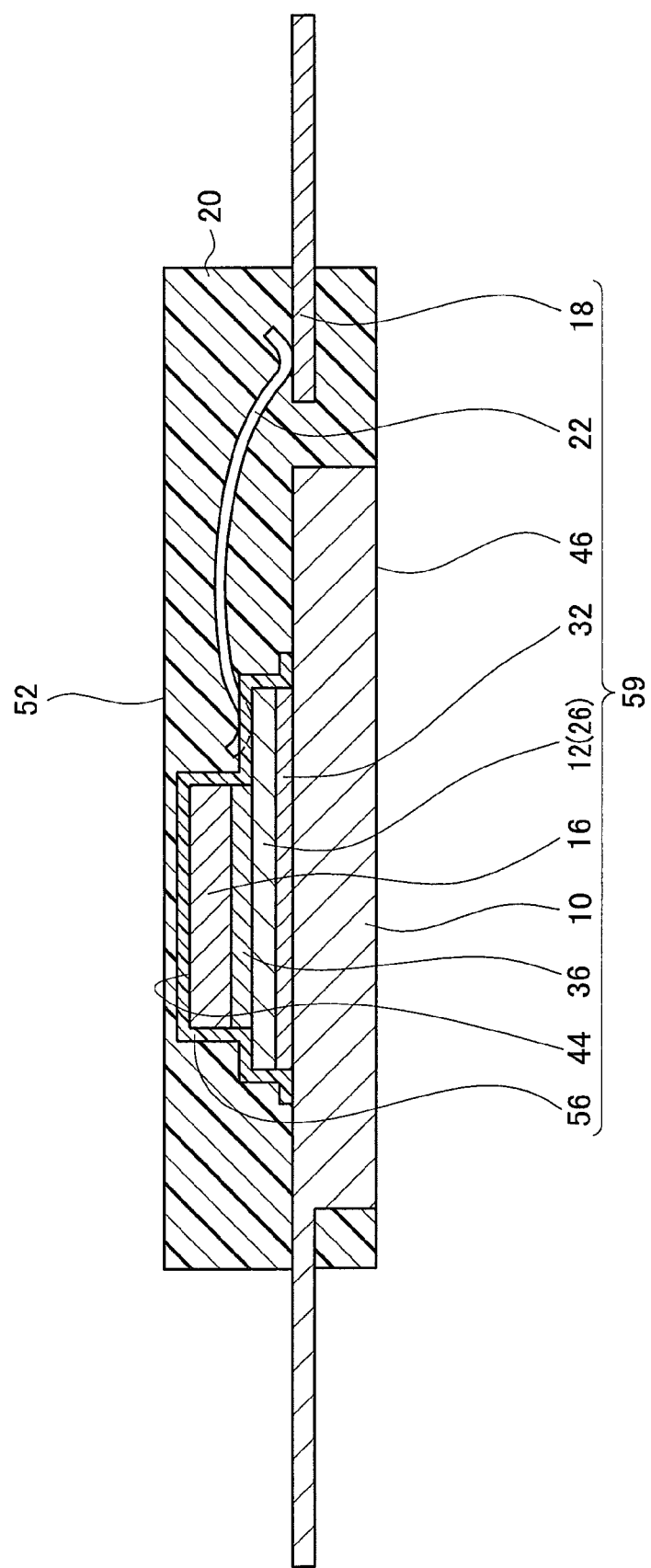
FIG. 7 is another view showing the modified example of the production method of Example 1.
Figure 8:
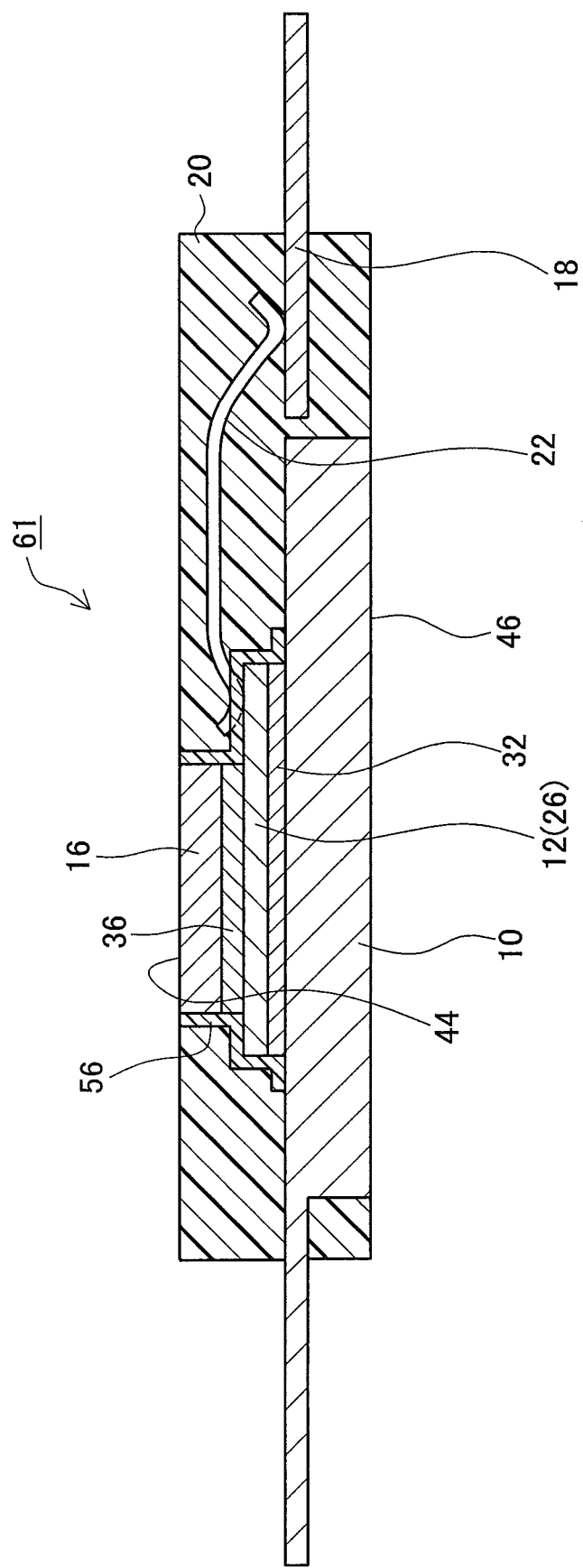
FIG. 8 is another view showing the modified example of the production method of Example 1.
Figure 9:
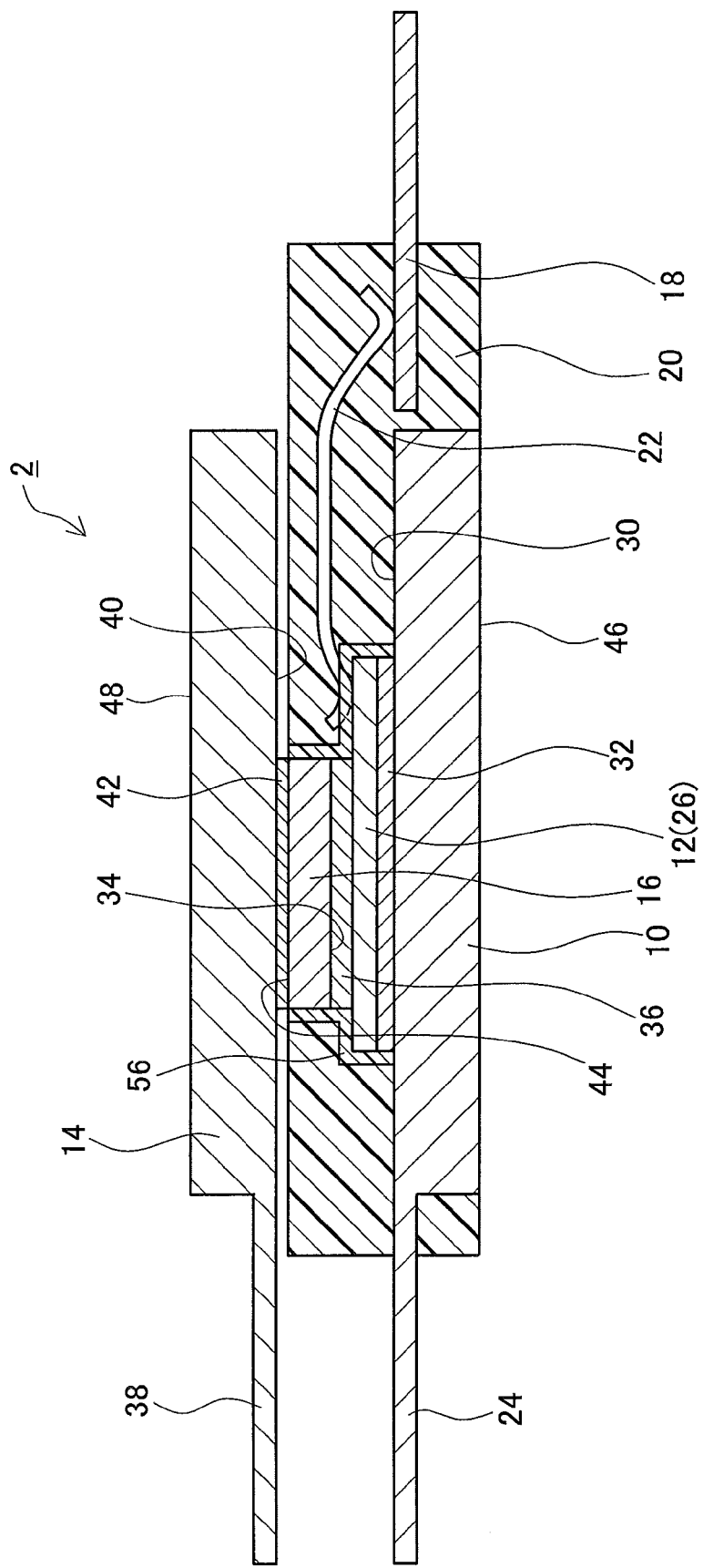
FIG. 9 is another view showing the modified example of the production method of Example 1.

More specifically, after forming the composite body 50 shown in FIG. 3 as described above, polyamide resin 56 is applied from a dispenser 58 around the electrode plate block 16 (electrode plate block 16 and the power device 12) as shown in FIG. 6. Next, the space surrounding a composite body 59 provided with the polyamide resin 56 is sealed with the sealing resin 20 as shown in FIG. 7, after which the sealing resin 20 and the polyamide resin 56 are ground to form a sealed composite body 61 with the surface 44 of the electrode plate block 16 being exposed as shown in FIG. 8, and then the upper electrode plate 14 is bonded to the electrode plate block 16 as shown in FIG. 9.

A semiconductor device 2 is thus produced.

Stress due to cure shrinkage tends to remain slightly in the sealing resin 20 around the electrode plate block 16. Depending on the usage conditions of the semiconductor device 1, there is a possibility that separation may occur in the bonded portion between the electrode plate block 16 and the sealing resin 20. Therefore, provision of the polyamide resin 56 around the electrode plate block 16 as shown in FIGS. 6 to 9 can positively suppress separation in the bonded portion between the electrode plate block 16 and the sealing resin 20. Alternatively, polyamide may be applied over a wider area on the upper surface 30 to enhance the intimate contact between the upper surface 30 of the backside electrode plate 10 and the sealing resin 20.

In this example, the polyamide resin 56 can be provided easily to the electrode plate block 16 only by dropping a stock solution of the polyamide resin 56 from the dispenser 58 to the composite body 50 before bonding the upper electrode plate 14. Limited application of the polyamide resin 56 by the dispenser 58 to only around the electrode plate block 16 can maximally reduce the amount of use of the polyamide resin 56. Also, because of the application of a stock solution of the polyamide resin 56 in a dropping manner from the dispenser 58, the stock solution of the polyamide resin 56 does not scatter around. Also, the application of the stock solution of the polyamide resin 56 using the dispenser 58 in a dropping manner prevents the stock solution of the polyamide resin 56 before being dropped from contacting ambient air and absorbing moisture, i.e., prevents the stock solution of the polyamide resin 56 before being dropped from being contaminated by a foreign substance adhered thereto, so that the stock solution of polyamide resin 56 inside the dispenser 58 can almost entirely be used, whereby the material cost of the polyamide resin 5 can be made low. Moreover, since the application surface of the polyamide resin 56 can be visually checked directly from a vertical direction, defect inspection of the polyamide resin 56 is carried out with good operation efficiency.

It should be noted here that a polyimide resin may be used instead of the polyamide resin 56.

EXAMPLE 2

Figure 10:
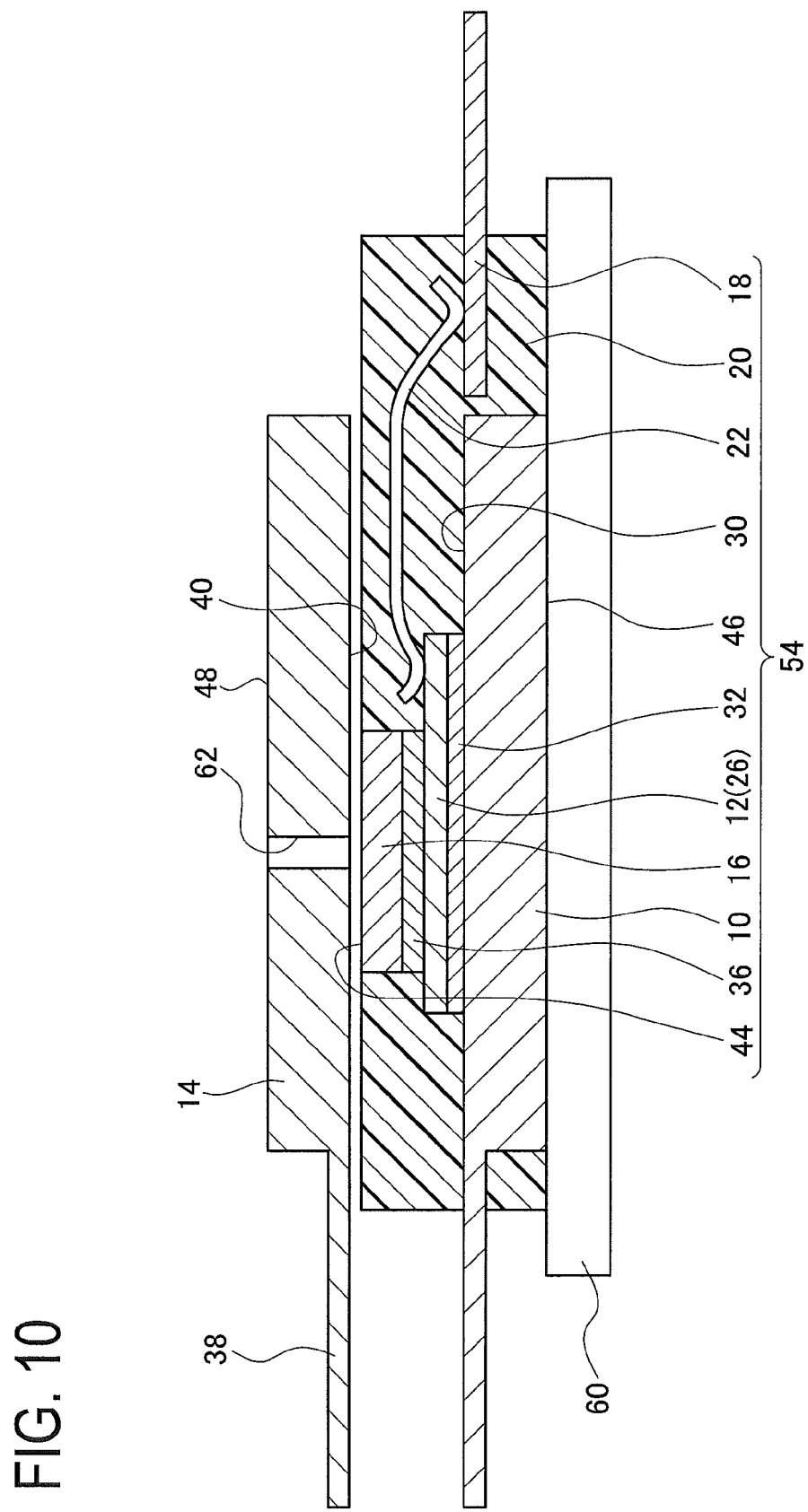
FIG. 10 is a view showing a production method of Example 2.
Figure 11:
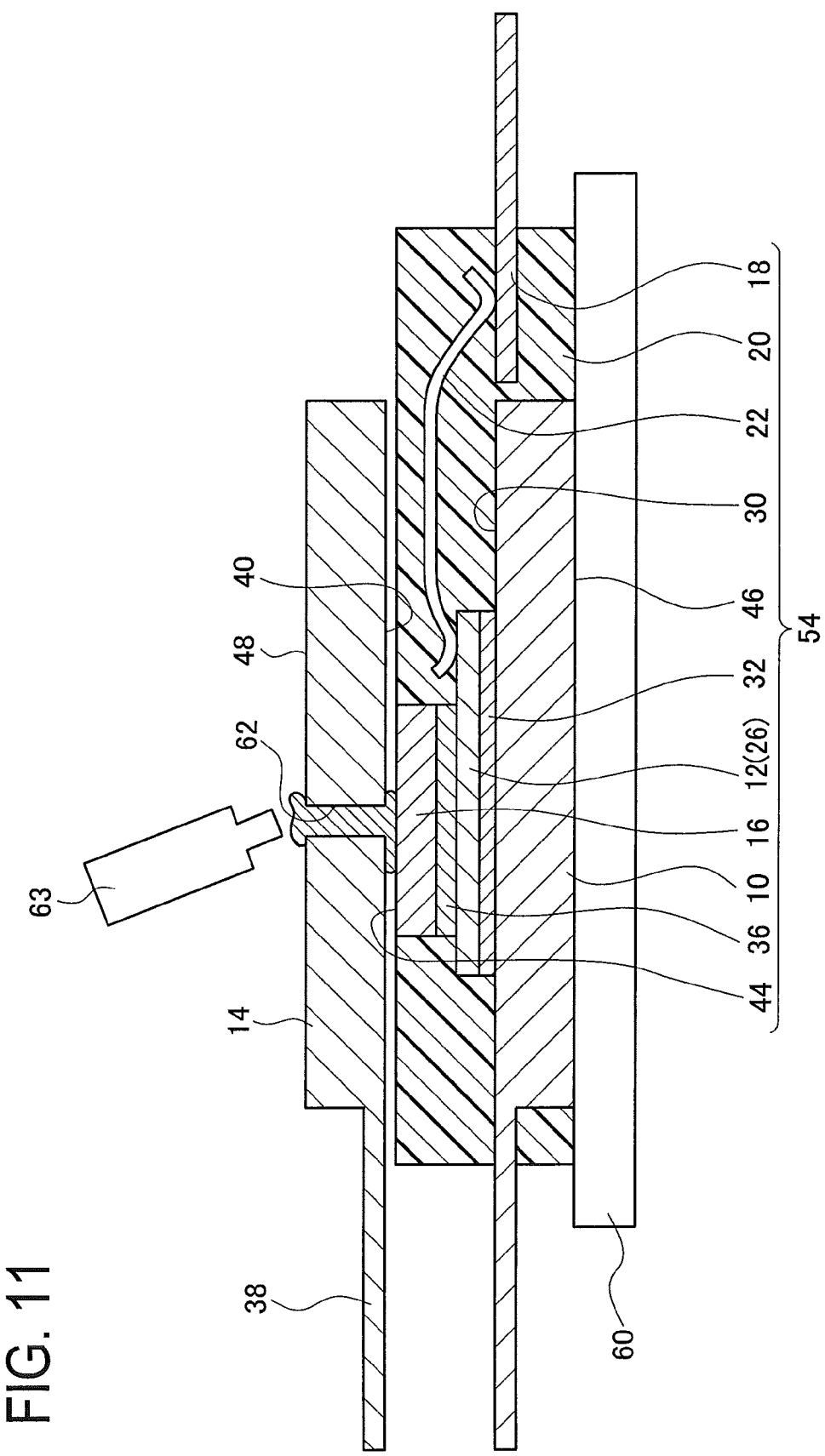
FIG. 11 is another view showing the production method of Example 2.
Figure 12:
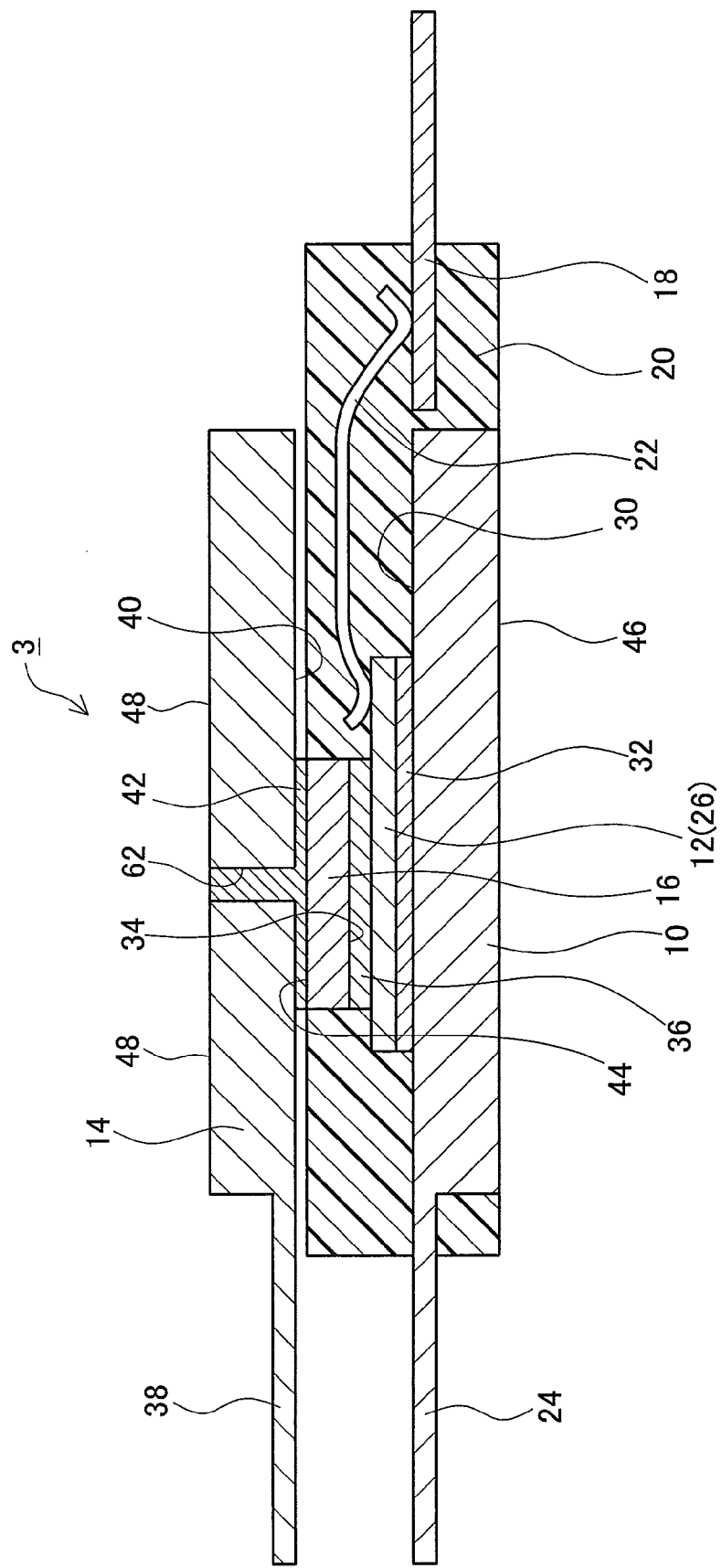
FIG. 12 is another view showing the production method of Example 2.

FIGS. 10 to 12 are diagrams showing the production method of Example 2.

Example 2 has a characteristic feature in the method of bonding by soldering between the upper electrode plate 14 and the electrode plate block 16 of the production method of Example 1. More specifically, the sealed composite body 54 is preheated by a pre-heater 60 as shown in FIG. 10. The preheating here is done at a temperature lower than the melting point of the solder used for the solder layer 32 or 36 and lower than a heat proof temperature of the sealing resin 20. For example, if the melting point of the solder used for the solder layer 32 or 36 is equal to or higher than 230° C. and not exceeding 260° C. and the heat proof temperature of the sealing resin 20 is 180° C., then the sealed composite body 54 is preheated at a temperature equal to or higher than 120° C. and lower than 180° C.

The upper electrode plate 14 is then mounted on the sealed composite body 54. The upper electrode plate 14 should preferably be preheated by a pre-heater or the like (not shown) before being mounted on the sealed composite body 54 and should be kept heated with hot air or the like even after being mounted on the sealed composite body 54.

Next, as shown in FIG. 11, molten solder is supplied from a dispenser 63 through a through hole 62 extending through the upper electrode plate 14 to open on the inner surface 40 and the outer surface 48 thereof. The solder used here is either the same solder as that used for the solder layer 32 or 36, or a solder having a more or less the same melting point. For example, if the melting point of the solder used for the solder layer 32 or 36 is equal to or higher than 230° C. and not exceeding 260° C., the same solder could be used, or, a solder having a melting point of 140° C. or higher and not exceeding 210° C. could be used as the solder having a more or less the same melting point.

As such solder is supplied in a molten state through the through hole 62, while the temperature of the surface 44 of the electrode plate block 16 is lower than the melting point of the solder being supplied from the through hole 62, remaining heat helps the solder in a molten state to spread by a capillary force as it gradually sets between the upper electrode plate 14 and the electrode plate block 16 to form the solder layer 42.

Since redundant solder spills out of the through hole 62, the dispenser 63 can have lower control accuracy of the supply amount of the solder.

Any oxide film that may be formed on the surface 44 of the electrode plate block 16 or the surface 40 of the upper electrode plate 14 will inhibit soldering between the electrode plate block 16 and the upper electrode plate 14. Therefore, preheating of the sealed composite body 54 and heating during soldering are carried out in an atmosphere of a reductive gas such as a mixture of nitrogen and hydrogen so as to remove any oxide film on the surface 44 of the electrode plate block 16. Alternatively, since there are no points with a potential difference in or near the soldered portion between the upper electrode plate 14 and the surface 44 of the electrode plate block 16 because any such points with a possible potential difference in the sealed composite body 54 are sealed with the sealing resin 20 and not exposed, a flux material may be mixed beforehand in the solder to be injected from the through hole 62, or a flux material may be applied beforehand on the surface 44 of the electrode plate block 16 by spraying or with a brush, so as to chemically remove any oxide film on the surface 44 of the electrode plate block 16.

Also, the solder layer 42 can be formed at the same time as degassing under a reduced pressure so as to prevent formation of voids inside the solder layer 42.

Next, the outer surface 48 of the upper electrode plate 14 is surface-finished. More specifically, any redundant solder that has spilled out of the through hole 62 onto the outer surface 48 of the upper electrode plate 14 could be molten and removed with a soldering iron heated to a temperature higher than the melting point of the solder, or, could be removed by cutting using a cutter. A semiconductor device 3 is produced through the process described above as shown in FIG. 12.

As described above, in this example, the sealed composite body 54 is preheated to a temperature lower than the melting point of the solder used for the solder layer 32 or 36 and lower than the heat proof temperature of the sealing resin 20 before forming the solder layer 42. Therefore, the same solder as that used for the solder layer 32 or 36, or a solder having a more or less the same melting point, can be used for the solder layer 42. Accordingly, there is no need to use a low-melting-point solder that is expensive and may have poor bondability, and so high bondability is achieved in the solder layer 42 while production costs are kept low.

Figure 13:
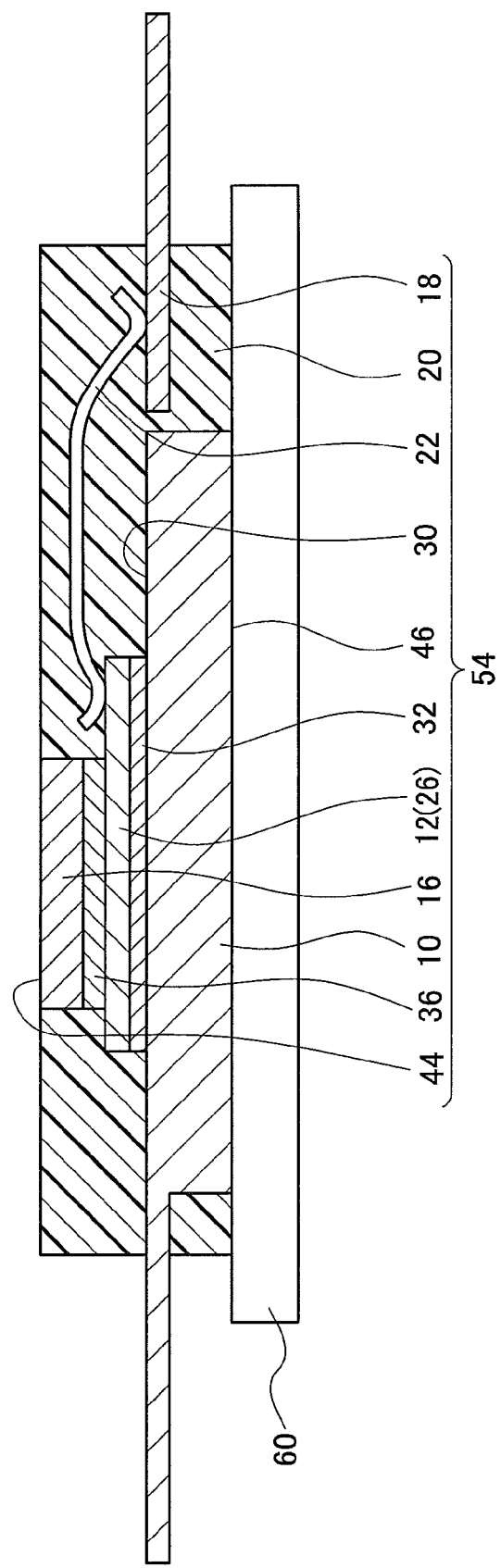
FIG. 13 is a view showing a modified example of the production method of Example 2.
Figure 14:
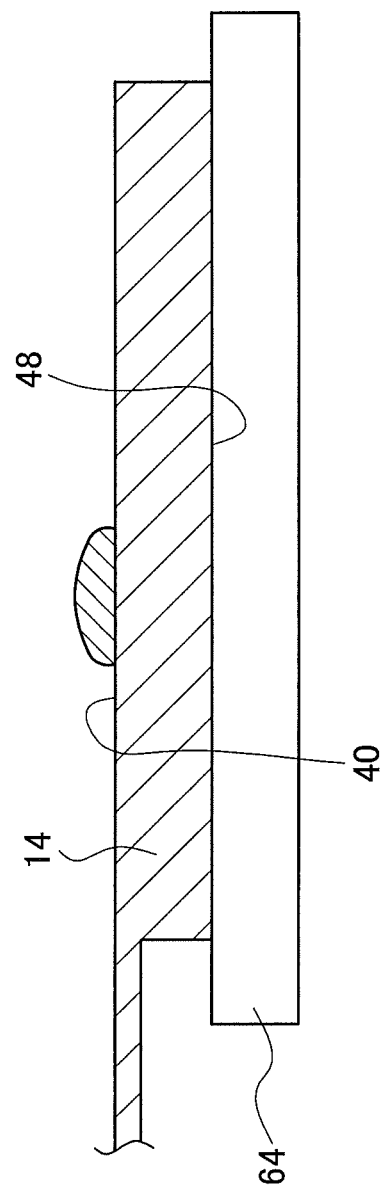
FIG. 14 is another view showing the modified example of the production method of Example 2.
Figure 15:
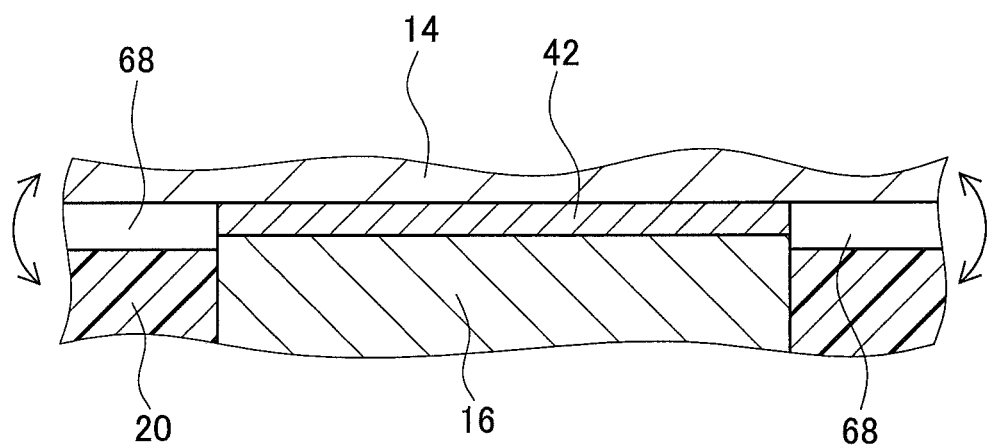
FIG. 15 is a view showing a joint portion between an upper electrode plate and a block electrode plate.

There could be a modified example as shown in FIGS. 13 to 15. First, as shown in FIG. 13, the sealed composite body 54 is preheated by the pre-heater 60 similarly to FIG. 10. Meanwhile, solder is applied to the inner surface 40 of the upper electrode plate 14 as shown in FIG. 14, and the upper electrode plate 14 is heated to a temperature higher than the melting point of the solder with a heater 64 to keep the solder in a molten state. Application of solder on the inner surface 40 of the upper electrode plate 14 could be achieved, for example, by dropping the solder in a molten state onto the inner surface 40 of the upper electrode plate 14, or by placing the solder in the form of a sheet on the inner surface 40 of the upper electrode plate 14.

With the sealed composite body 54 preheated by the pre-heater 60, while keeping the upper electrode plate 14 warm with hot air so that its temperature does not drop, it is inverted in a short period of time to deposit the solder in a molten state on the inner surface 40 of the upper electrode plate 14 upon the surface 44 of the electrode plate block 16 to bond them. The semiconductor device 1 shown in FIG. 2 described above is produced through the process described above.

In such a modified example, too, the same solder as that used for the solder layer 32 or 36, or a solder having a more or less the same melting point, can be used for the solder layer 42, and therefore high bondability is achieved in the solder layer 42 while production costs are kept low.

The solder in a molten state spreads between the surface 44 of the electrode plate block 16 and the inner surface 40 of the upper electrode plate 14 by a capillary force as it gradually sets, and forms the solder layer 42.

Further, since there is no need to provide the through hole 62 in the upper electrode plate 14, production costs can be made even lower.

EXAMPLE 3

Let us now assume that the surface 44 of the electrode plate block 16 is coplanar with the surface 66 of the sealing resin 20, or that the surface 44 of the electrode plate block 16 is protruded more than the surface 66 of the sealing resin 20, in the sealed composite body 54. In these cases, if the solder layer 42 is formed between the surface 44 of the electrode plate block 16 and the inner surface 40 of the upper electrode plate 14, a gap 68 is formed between the inner surface 40 of the upper electrode plate 14 and the surface 66 of the sealing resin 20 as shown in FIG. 15. With such a gap 68 present, when the upper electrode plate 14 is subjected to an external force, the solder layer 42 may be subjected to a large stress due to forces acting thereon in directions of arrows in FIG. 15.

Figure 16:
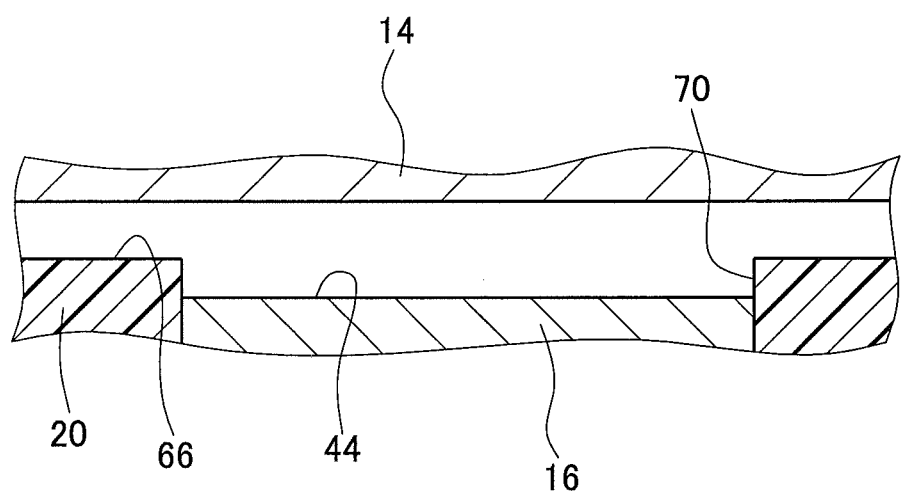
FIG. 16 is a view showing a production method of Example 3.

Therefore, in this example, the surface 44 of the electrode plate block 16 is made lower than the surface 66 of the sealing resin 20 so that the surface 44 of the electrode plate block 16 is recessed more than the surface 66 in a direction of arrangement of the power device 12 and the electrode plate block 16 to provide a recess 70 in the sealed composite body 54 as shown in FIG. 16. The solder layer 42 is formed in this recess 70 to bond the upper electrode plate 14 and the electrode plate block 16 together.

Figure 17:
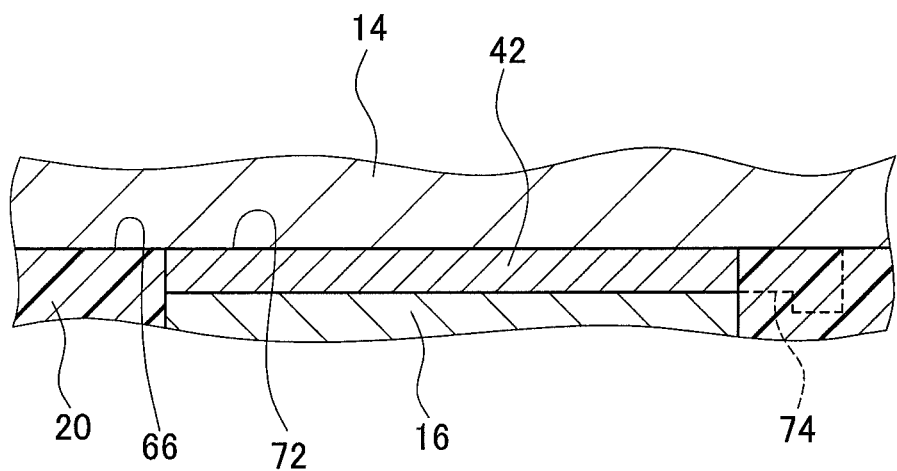
FIG. 17 is another view showing the production method of Example 3.

Thereby, there is no gap 68 formed between the inner surface 40 of the upper electrode plate 14 and the surface 66 of the sealing resin 20 as shown in FIG. 17. Since the upper electrode plate 14 is supported on a surface 72 of the solder layer 42 and the surface 66 of the sealing resin 20, no large stress is generated in the solder layer 42 even when the upper electrode plate 14 receives any external force.

For the sealing resin 20, a material having a substantially equal linear expansion coefficient as the backside electrode plate 10 and the electrode plate block 16 should preferably be used. Thereby, the thermal stress caused by expansion and contraction of the sealing resin 20 in thermal cycles under usage environments of the semiconductor device will be reduced. Accordingly, the intimate contact between the electrode plate 10 or the electrode plate block 16 and the sealing resin 20 can be maintained, as well as the bond between the upper electrode plate 14 and the electrode plate block 16 can be maintained.

If the solder layer 42 has a thickness greater than 200 μm, the impact of a difference in linear expansion coefficient between the solder used for the solder layer 42 and the sealing resin 20, and the impact of setting shrinkage during soldering, will be larger. This will in turn increase the impact of the thermal stress caused by expansion and contraction of the sealing resin 20 in thermal cycles under usage environments of the semiconductor device. Thus, the bond between the upper electrode plate 14 and the electrode plate block 16 may not be maintained. Therefore, the thickness of the recess 70 should preferably be 200 μm or less.

Further, a pocket 74 can be provided in the sealing resin 20 for allowing any redundant solder to escape so as to eliminate the possibility that redundant resin spills out of the recess 70 and enters between the inner surface 40 of the upper electrode plate 14 and the surface 66 of the sealing resin 20.

Alternatively, adhesive (not shown) may be applied between the upper electrode plate 14 and the sealing resin 20 to enhance the intimate contact strength between the upper electrode plate 14 and the sealing resin 20.

Preferably, hard components such as glass or inorganic material should be added to the sealing resin 20 to increase its hardness. Thereby, the cutting amount of the electrode plate block 16 can selectively be made larger than the cutting amount of the sealing resin 20 when the electrode plate block 16 and the sealing resin 20 are ground under the same condition (for example by milling), so that the recess 70 can be formed easily.

EXAMPLE 4

FIGS. 18 to 21 are diagrams showing the production method of Example 4.

This example is distinguished from Example 1 in that the upper electrode plate 14 and the electrode plate block 16 are not bonded together, but are brought into pressure contact with each other, to form the semiconductor device 1.

Figure 18:
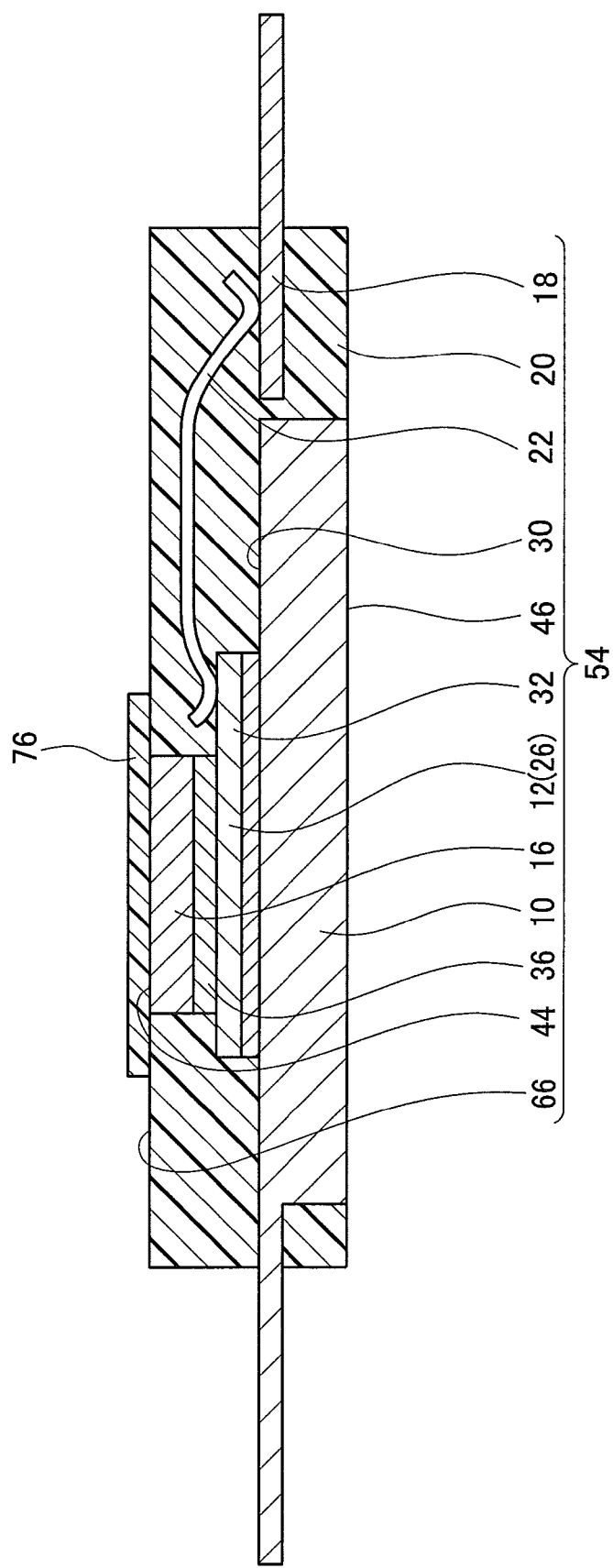
FIG. 18 is a view showing a production method of Example 4.

More specifically, first, a heat-dissipating silicone grease 76 is applied on the surface 44 of the electrode plate block 16 and the surface 66 of the sealing resin 20 around the surface 44 of the electrode plate block 16 in the sealed composite body 54 as shown in FIG. 18 with a brush or a dispenser, or by screen printing or metal mask printing (one example of a heat-dissipating material application step of the present invention).

Figure 19:
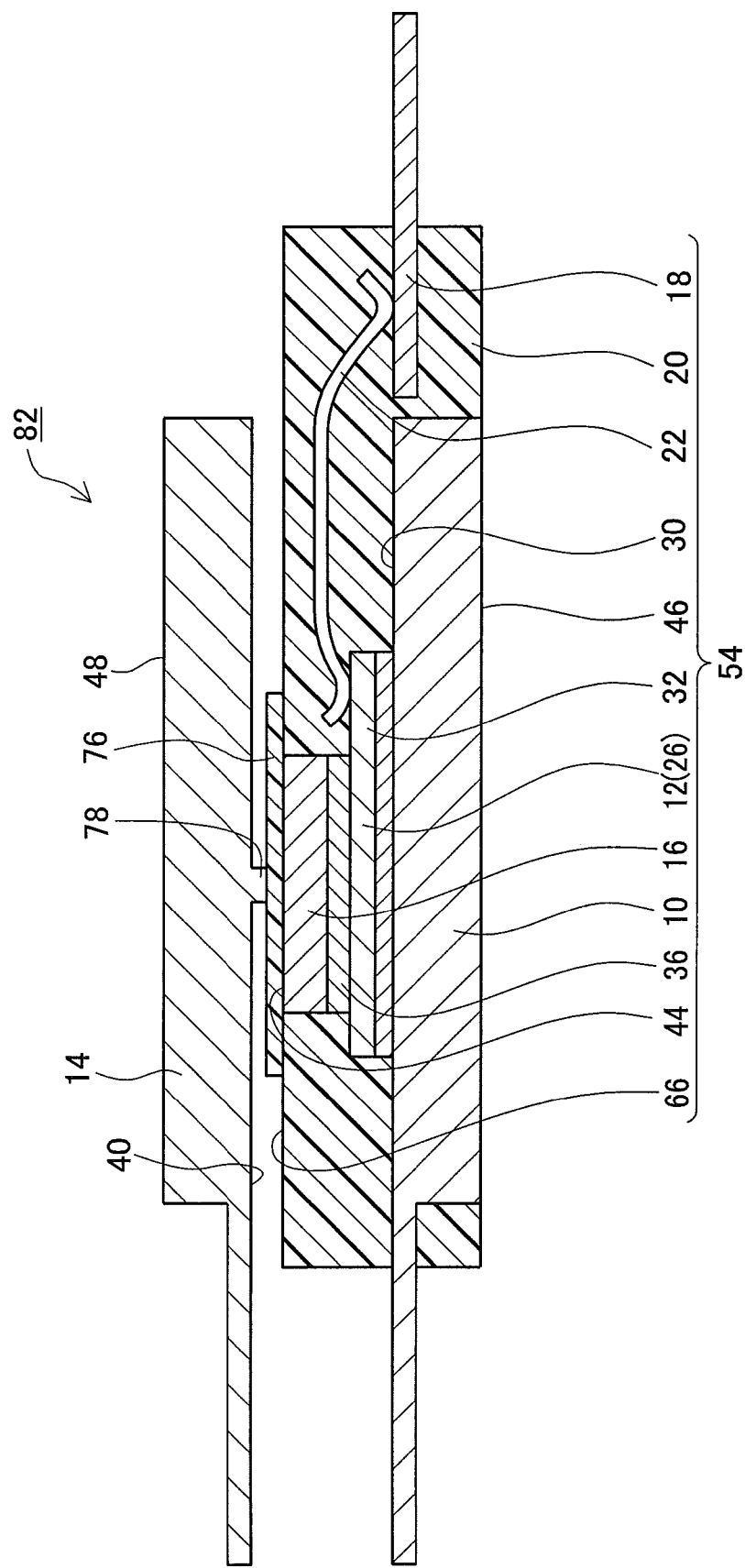
FIG. 19 is another view showing the production method of Example 4.

Next, the upper electrode plate 14 is placed on the surface 44 of the electrode plate block 16 on the side on which the heat-dissipating silicone grease 76 has been applied as shown in FIG. 19. The upper electrode plate 14 at this time is provided with a protrusion 78 on the inner surface 40 thereof.

Figure 20:
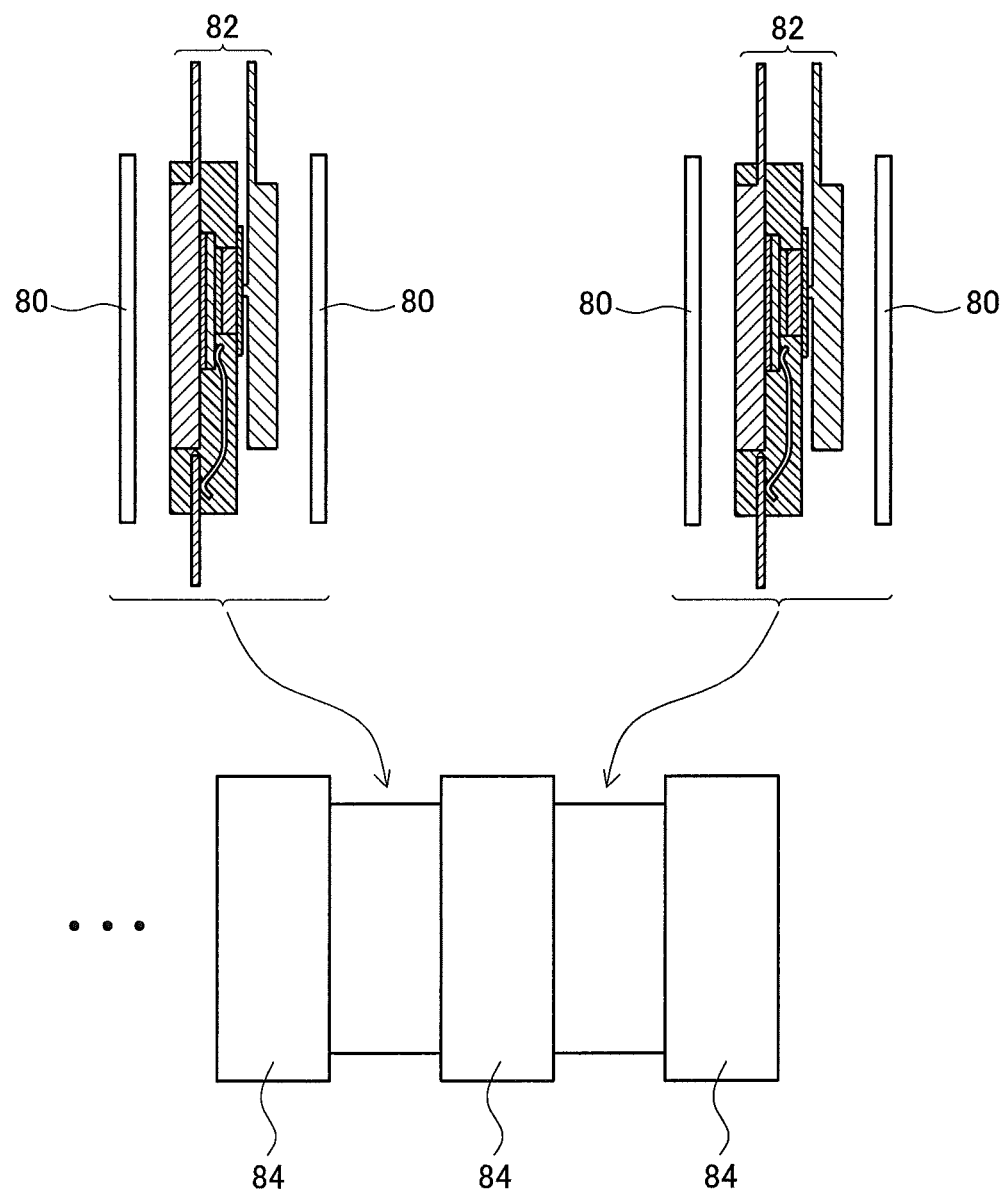
FIG. 20 is another view showing the production method of Example 4.

Next, this pre-pressure contact composite body 82 is inserted in between respective cooling tubes 84 of a double-sided cooler as shown in FIG. 20. At this time, heat-dissipating silicone grease (not shown) is applied on an outer surface 48 of the upper electrode plate 14 and an outer surface 46 of the backside electrode plate 10, on which an insulating substrate 80 is placed, which is also applied with heat-dissipating silicone grease (not shown).

Figure 21:
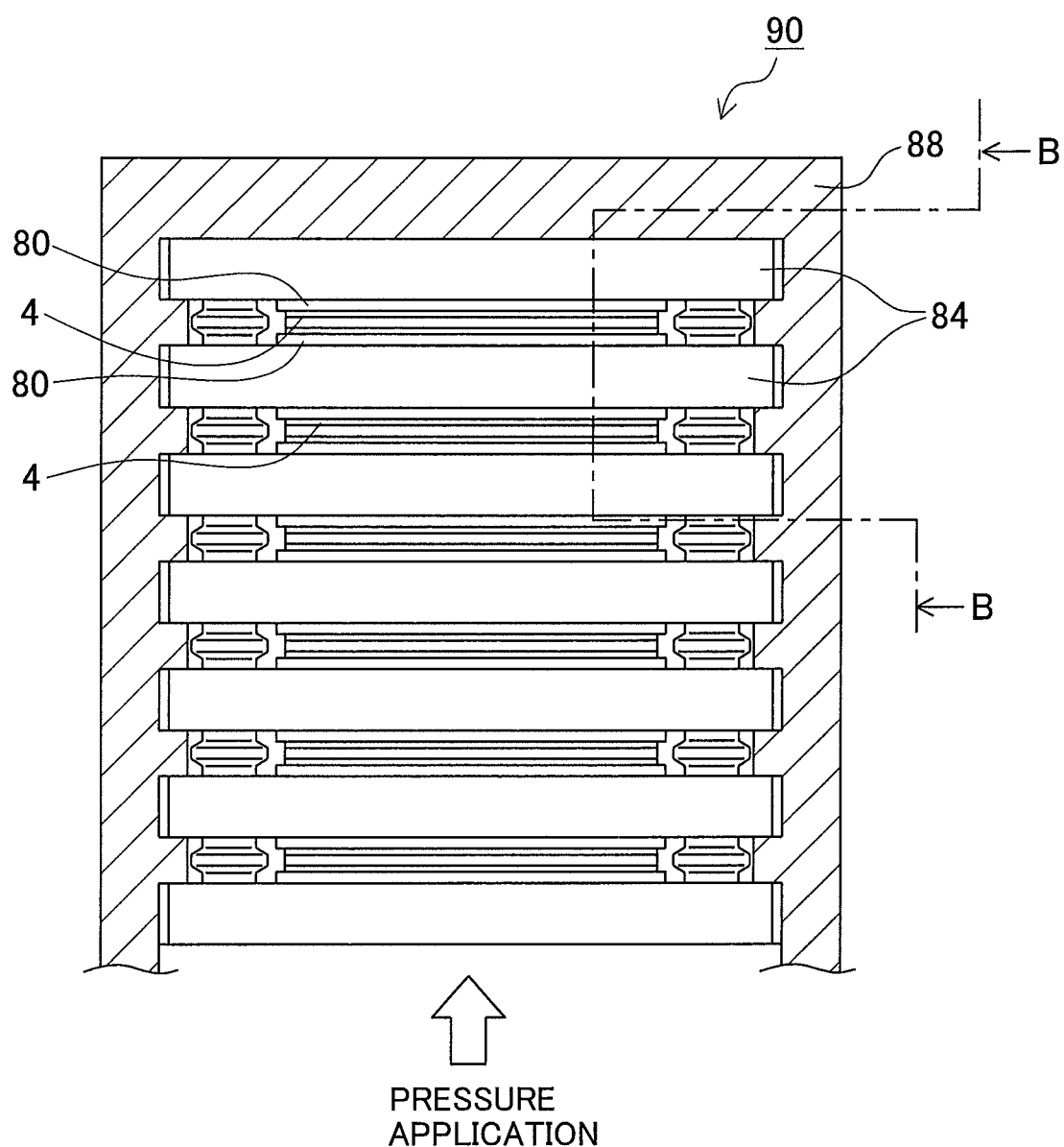
FIG. 21 is a plan view of a part of a laminated power module in the production method of Example 4.
Figure 22:
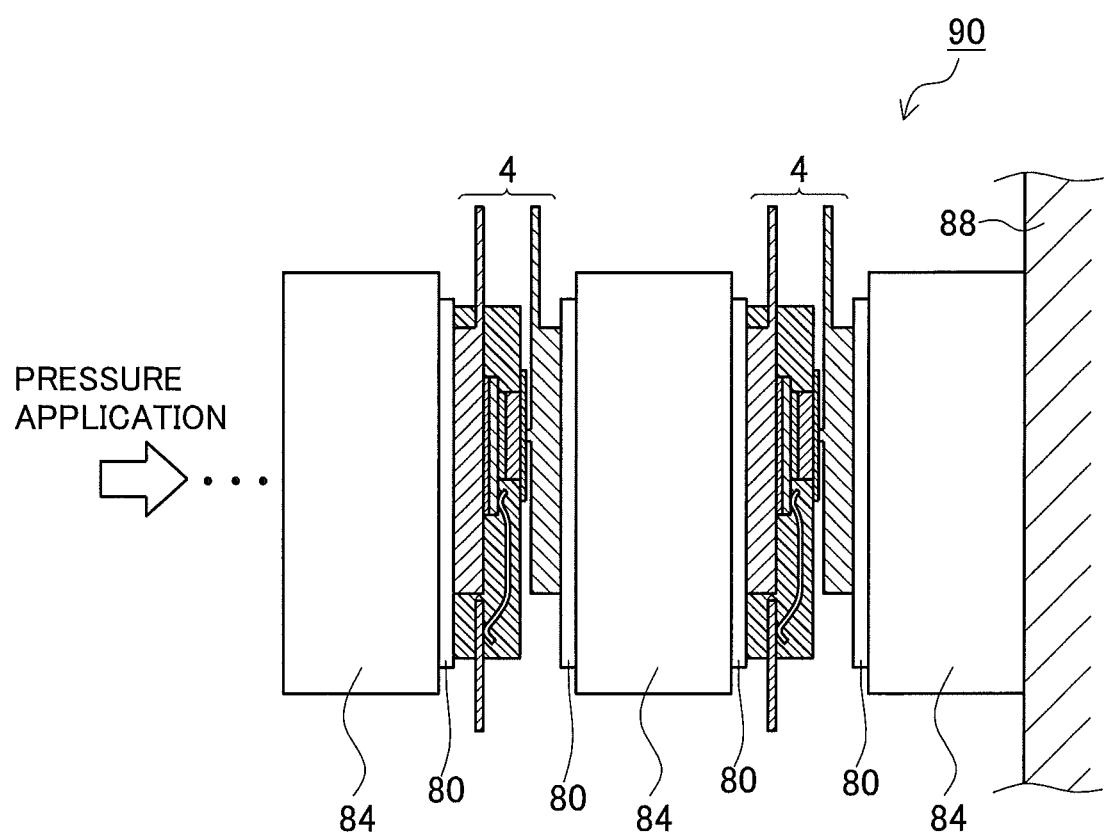
FIG. 22 is a cross sectional view taken along a line B-B in FIG. 21.
Figure 23:
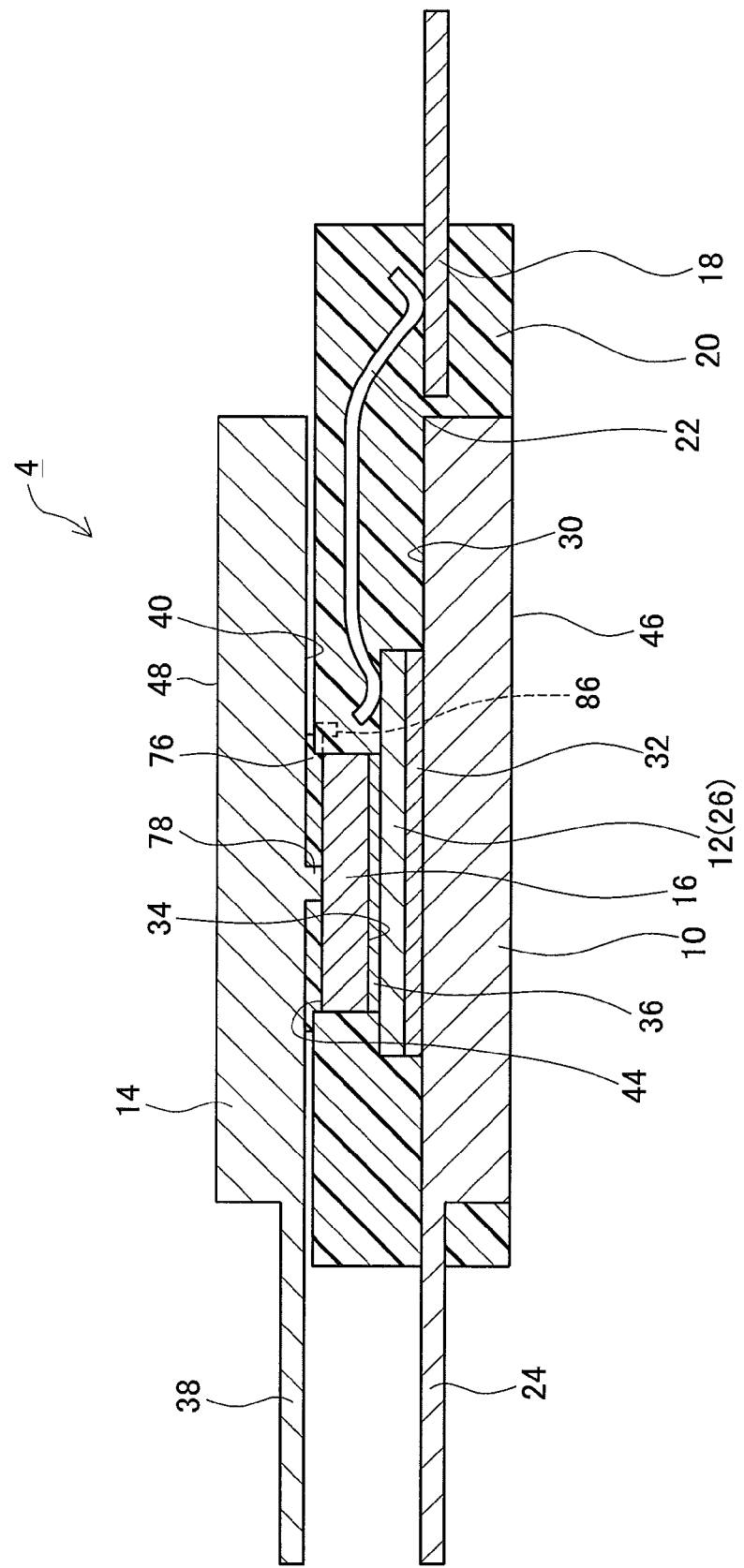
FIG. 23 is a view showing a semiconductor device produced by the production method of Example 4.

Next, respective cooling tubes 84 are mounted in a housing 88 to produce a laminated power module 90 as shown in FIGS. 21 and 22. Here, pressure is applied to the laminated power modules 90 through the cooling tubes 84 by a spring (not shown). An external force is thereby applied to the pre-pressure contact composite body 82, whereby the protrusion 78 on the upper electrode plate 14 breaks through the heat-dissipating silicone grease 76 to make pressure contact with the electrode plate block 16 (one example of a pressure contact step of the present invention). A semiconductor device 4 shown in FIG. 23 is produced from the pre-pressure contact composite body 82 through the process described above. FIG. 21 is a plan view of part of the laminated power module 90, and FIG. 22 is a cross sectional view taken along a line B-B in FIG. 21.

As described above, in this example, the protrusion 78 is provided on the upper electrode plate 14 to make pressure contact with the electrode plate block 16 so as to connect the upper electrode plate 14 and the electrode plate block 16 electrically and thermally.

As the bonding material for bonding the upper electrode plate 14 and the electrode plate block 16 and the heating step are no longer necessary, production costs can be kept low. Moreover, heat generated in the electrode plate block 16 by a large current flowing therein is dissipated through the heat-dissipating silicone grease 76 from the electrode plate block 16 to the upper electrode plate 14, and thus a large current can flow between the upper electrode plate 14 and the electrode plate block 16. In an application where the amount of heat generated in connected portions between the upper electrode plate 14 and the electrode plate block 16 is low, there could be an example in which no heat-dissipating silicone grease 76 is provided.

When bringing the upper electrode plate 14 into pressure contact with the electrode plate block 16 with the protrusion 78, they may be temporarily fixed with adhesive applied between the inner surface 40 of the upper electrode plate 14 and the surface 66 of the sealing resin 20, with care being taken not to break the electrical connection between the upper electrode plate 14 and the electrode plate block 16. This can prevent any misalignment in relative positions of the upper electrode plate 14 and the electrode plate block 16.

If the height of the protrusion 78 of the upper electrode plate 14 is greater than 50 μm, the heat-dissipating silicone grease 76 present between the upper electrode plate 14 and the electrode plate block 16 will have too high a thermal resistance and may inhibit heat dissipation of the power device 12. On the other hand, if the height of the protrusion 78 of the upper electrode plate 14 is smaller than several μm, the protrusion will be smaller than an inorganic filler (not shown) having heat conductivity and added in the heat-dissipating silicone grease 76, because of which the upper electrode plate 14 may not be able to make pressure contact with the electrode plate block 16 because of the inorganic filler stuck between the upper electrode plate 14 and the electrode plate block 16. Therefore, the height of the protrusion 78 of the upper electrode plate 14 should preferably be more than several μm and not exceeding 50 μm.

In order to make sure the protrusion 78 of the upper electrode plate 14 can break through the heat-dissipating silicone grease 76 as well as suppress abnormal heat generation by a current flowing through a contact between itself and the electrode plate block 16, the protrusion 78 should preferably have a size set within a range from about 1 mm×1 mm to 8 mm×8 mm. The protrusion 78 of the upper electrode plate 14 should preferably have a conical tip. One upper electrode plate 14 may not necessarily have just one protrusion 78 and may be provided with two or more protrusions 78. Such protrusion(s) 78 of the upper electrode plate 14 can easily be formed by forging, grinding, or etching. It could also be formed by wire bonding using aluminum or gold, or by attaching a high-conductivity metal piece by ultrasonic bonding or with conductive resin, or brazing, press-fitting, or the like.

Note, a conductive paste may be applied instead of the heat-dissipating silicone grease 76. Alternatively, a carbon sheet with a cut-out in a portion corresponding to the protrusion 78 of the upper electrode plate 14 may be used. A carbon sheet, in particular, with carbon fibers oriented along a thickness direction to have improved heat conductivity, is preferable for the carbon sheet.

Further, a pocket 86 (see FIG. 23) can be provided in the sealing resin 20 for allowing any redundant heat-dissipating silicone grease 76 to escape so as to prevent redundant heat-dissipating silicone grease 76 from spilling out and entering between the inner surface 40 of the upper electrode plate 14 and the surface 66 of the sealing resin 20. This can positively maintain the intimate contact between the upper electrode plate 14 and the sealing resin 20 and reduce variations in thickness of the pre-pressure contact composite body 82 after the pressure contact.

This example further provides the following effects similarly to Example 1.

The surrounding space of the composite body 50 before bringing the upper electrode plate 14 into pressure contact with the electrode plate block 16 is sealed with the sealing resin 20 to form the sealed composite body 54, after which the upper electrode plate 14 is brought into pressure contact with the electrode plate block 16. Therefore, separation in the bonded portion between the backside electrode plate 10 and the sealing resin 20 due to shrinkage of the sealing resin 20 can be prevented. Similarly, separation in the bonded portion between the power device 12 and the sealing resin 20, and separation in the bonded portion between the electrode plate block 16 and the sealing resin 20 can also be prevented.

Further, in this example, since the sealed composite body 54 is formed without the upper electrode plate 14 making pressure contact with the electrode plate block 16, the sealing resin 20 is not bonded to the upper electrode plate 14. Therefore, even though the sealing resin 20 undergoes shrinkage during the production process of the semiconductor device 4 or in thermal cycles under usage environments of the semiconductor device 4, the stress is not trapped in the sealing resin 20 between the backside electrode plate 10 and the upper electrode plate 14. Accordingly, separation in bonded portions between the backside electrode plate 10, the power device 12, or the electrode plate block 16 and the sealing resin 20 can be prevented.

This in turn means that the intimate contact between the backside electrode plate 10, the power device 12, or the electrode plate block 16 and the sealing resin 20 can be ensured without providing a coating of resin such as polyamide resin or polyimide resin, whereby reliability of the semiconductor device 4 can be improved while the complexity of production operations is reduced and production costs are kept low.

Further, the sealing resin 20 is provided further than the inner surface 40 of the upper electrode plate 14 toward the side where the electrode plate block 16 is disposed in a direction of arrangement of the electrode plate block 16 and the upper electrode plate 14, and not provided on the side of the outer surface 48 further than the inner surface 40 of the upper electrode plate 14. Therefore the amount of use of the sealing resin 20 can be reduced, which leads to a reduction in the cost of the sealing resin 20 and in the weight of the semiconductor device 4.

The above embodiment merely shows examples and does not set any limits in the present invention. It should be understood that the present invention may be embodied in other specific forms without departing from the essential characteristics thereof.

DESCRIPTION OF THE REFERENCE SIGNS

1 Semiconductor device
10 Backside electrode plate
12 Power device
14 Upper electrode plate
16 Electrode plate block
18 Control terminal
20 Sealing resin
22 Control line
26 IGBT
28 Diode
30 Inner surface
32 Solder layer
33 Surface
34 Surface
36 Solder layer
37 Surface
38 Bus bar
40 Inner surface
42 Solder layer
44 Surface
46 Outer surface
48 Outer surface
50 Composite body
52 Surface
54 Sealed composite body
56 Polyamide resin
58 Dispenser
59 Composite body
60 Pre-heater
61 Sealed composite body
62 Through hole
64 Heater
66 Surface
70 Recess
72 Surface
76 Heat-dissipating silicone grease
78 Protrusion
82 Pre-pressure contact composite body
84 Cooling tube

The invention claimed is:

1. A method of producing a semiconductor device, the method including a first bonding step of bonding a first surface of a first electrode plate and a first surface of a semiconductor device portion, and a second bonding step of bonding a second surface of the semiconductor device portion and a first surface of a second electrode plate, wherein the method includes a sealing step of forming a sealed composite body by covering target surfaces of a composite body of the first electrode plate and the semiconductor device portion formed by the first bonding step with resin, the target surfaces being surfaces other than a second surface of the first electrode plate and the second surface of the semiconductor device portion, and the second bonding step is performed after the sealing step.

2. The method of producing a semiconductor device according to claim 1, wherein the sealing step includes forming the sealed composite body by covering the target surfaces of the composite body and the second surface of the semiconductor device portion with the resin and then removing the resin covering the second surface of the semiconductor device portion.

3. The method of producing a semiconductor device according to claim 1, wherein the second bonding step includes heating the sealed composite body to a temperature that is lower than a heat proof temperature of the resin and lower than a melting point of a first bonding material for bonding the first surface of the first electrode plate and the first surface of the semiconductor device portion.

4. The method of producing a semiconductor device according to claim 3, wherein the second bonding step includes providing a through hole in the second electrode plate extending through the second electrode plate to open on its first and second surfaces, and supplying a second bonding material through the through hole for bonding the second surface of the semiconductor device portion and the first surface of the second electrode plate.

5. The method of producing a semiconductor device according to claim 3, wherein the second bonding step includes heating the second electrode plate to a temperature that is higher than a melting point of the second bonding material for bonding the second surface of the semiconductor device portion and the first surface of the second electrode plate, and applying the second bonding material to the first surface of the second electrode plate.

6. The method of producing a semiconductor device according to claim 1, wherein
the sealing step includes forming a recess in the sealed composite body such that the second surface of the semiconductor device portion is recessed more than a surface of the resin in a direction of arrangement of the first electrode plate and the semiconductor device portion, and
the second bonding step includes forming a bonding layer in the recess for bonding the second surface of the semiconductor device portion and the first surface of the second electrode plate.

7. A method of producing a semiconductor device, the method including a first bonding step of bonding a first surface of a first electrode plate and a first surface of a semiconductor device portion,
wherein the method includes
a sealing step of forming a sealed composite body by covering target surfaces of a composite body of the first electrode plate and the semiconductor device portion formed by the first bonding step with resin, the target surfaces being surfaces other than a second surface of the first electrode plate and a second surface of the semiconductor device portion, and
a pressure contact step of bringing a protrusion provided on a first surface of a second electrode plate into pressure contact with the second surface of the semiconductor device portion of the sealed composite body.

8. The method of producing a semiconductor device according to claim 7, wherein the method includes a heat-dissipating material application step of applying a heat-dissipating material between the semiconductor device portion and the second electrode plate.

9. A semiconductor device in which a first surface of a first electrode plate is bonded to a first surface of a semiconductor device portion and a second surface of the semiconductor device portion is bonded to a first surface of a second electrode plate, wherein
the device includes a sealed composite body formed by covering target surfaces of a composite body of the first electrode plate and the semiconductor device portion with resin, the target surfaces being surfaces other than a second surface of the first electrode plate and the second surface of the semiconductor device portion, and
the resin portion of the sealed composite body is not bonded to the first surface of the second electrode plate, and is provided further than the first surface of the second electrode plate toward a side where the semiconductor device portion is disposed in a direction of arrangement of the semiconductor device portion and the second electrode plate.

10. The semiconductor device according to claim 9, wherein
the second electrode plate includes a through hole extending through the second electrode plate to open on its first and second surfaces.

11. The semiconductor device according to claim 9, wherein
the sealed composite body includes a recess formed such that the second surface of the semiconductor device portion is recessed more than a surface of the resin in a direction of arrangement of the first electrode plate and the semiconductor device portion, and a bonding layer formed in the recess for bonding the second surface of the semiconductor device portion and the first surface of the second electrode plate.

12. A semiconductor device in which a first surface of a first electrode plate is bonded to a first surface of a semiconductor device portion, wherein
the device includes
a second electrode plate having a first surface formed with a protrusion to make pressure contact with a second surface of the semiconductor device portion, and
a sealed composite body formed by covering target surfaces of a composite body of the first electrode plate and the semiconductor device portion with resin, the target surfaces being surfaces other than a second surface of the first electrode plate and the second surface of the semiconductor device portion, and
the resin portion of the sealed composite body is not bonded to the first surface of the second electrode plate, and is provided further than the first surface of the second electrode plate toward a side where the semiconductor device portion is disposed in a direction of arrangement of the semiconductor device portion and the second electrode plate.

* * * * *